(12) United States Patent
Ishizu et al.

(10) Patent No.: US 6,852,553 B2
(45) Date of Patent: Feb. 8, 2005

(54) SEMICONDUCTOR DEVICE FABRICATION METHOD AND SEMICONDUCTOR DEVICE FABRICATION APPARATUS

(75) Inventors: Akio Ishizu, Maruko (JP); Kazutoshi Takashima, Miyota (JP); Shiro Oba, Komoro (JP); Yoshihiko Kobayashi, Tateshina (JP); Tsutomu Ida, Komoro (JP); Shigeru Haga, Komoro (JP); Susumu Takada, Saku (JP); Iwamichi Koujiro, Komoro (JP); Norinaga Arai, Ueda (JP); Yuji Kakegawa, Saku (JP)

(73) Assignee: Renesas Technology Corp., Tokyo (JP)

( * ) Notice: Subject to any disclaimer, the term of this patent is extended or adjusted under 35 U.S.C. 154(b) by 267 days.

(21) Appl. No.: 10/129,305
(22) PCT Filed: Feb. 15, 2001
(86) PCT No.: PCT/JP01/01091
§ 371 (c)(1),
(2), (4) Date: May 3, 2002
(87) PCT Pub. No.: WO01/61754
PCT Pub. Date: Aug. 23, 2001

(65) Prior Publication Data
US 2003/0003622 A1 Jan. 2, 2003

(30) Foreign Application Priority Data
Feb. 15, 2000 (JP) .................................. PCT/JP00/00828
Feb. 15, 2000 (JP) ........................................ 2000-036821

(51) Int. Cl.⁷ .......................... H01L 21/00; H01L 21/44
(52) U.S. Cl. ........................................ 438/15; 438/106
(58) Field of Search ............................ 438/14, 15, 16, 438/17, 18, 106; 361/679, 728, 736, 737, 738; 324/500; 29/592.1, 593

(56) References Cited

U.S. PATENT DOCUMENTS

| | | | | |
|---|---|---|---|---|
| 6,350,647 B2 | * | 2/2002 | Sakao | 438/254 |
| 6,737,727 B2 | * | 5/2004 | Gates et al. | 257/531 |
| 6,743,671 B2 | * | 6/2004 | Hu et al. | 438/253 |

FOREIGN PATENT DOCUMENTS

| | | |
|---|---|---|
| JP | 4-359453 | 12/1992 |
| JP | 5-24036 | 2/1993 |
| JP | 5-124031 | 5/1993 |
| JP | 6-302707 | 10/1994 |
| JP | 7-40296 | 2/1995 |
| JP | 10-152808 | 1/1998 |
| JP | 10-44138 | 2/1998 |
| JP | 10-144814 | 5/1998 |
| JP | 11-186490 | 7/1999 |

* cited by examiner

Primary Examiner—Evan Pert
Assistant Examiner—Monica D. Harrison
(74) Attorney, Agent, or Firm—Mattingly Stanger & Malur, P.C.

(57) ABSTRACT

A method of manufacturing a semiconductor device able to reduce the number of manufacturing steps and attain the rationalization of a manufacturing line is disclosed. The semiconductor device is a high-frequency module assembled by mounting chip parts (22) and semiconductor pellets (21) onto each of wiring substrates (2) formed on a matrix substrate (27) after inspection. A defect mark (2e) is affixed to a wiring substrate (2) as a block judged to be defective in the inspection of the matrix substrate (27), then in a series of subsequent assembling steps the defect mark (e) is recognized and the assembling work for the wiring substrate (2) with the defect mark (2e) thereon is omitted to attain the rationalization of a manufacturing line.

20 Claims, 31 Drawing Sheets

FIG. 10
(a)
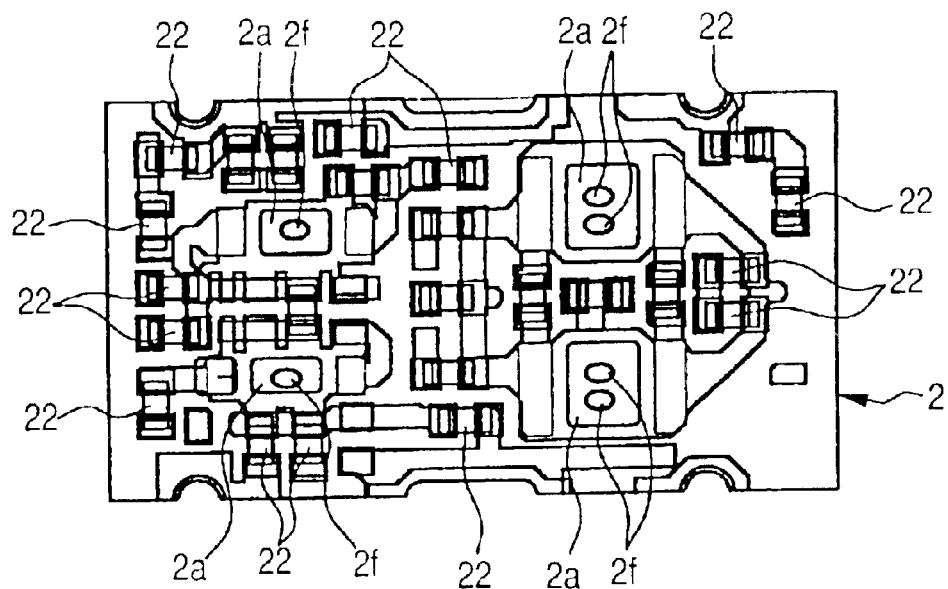
(b)
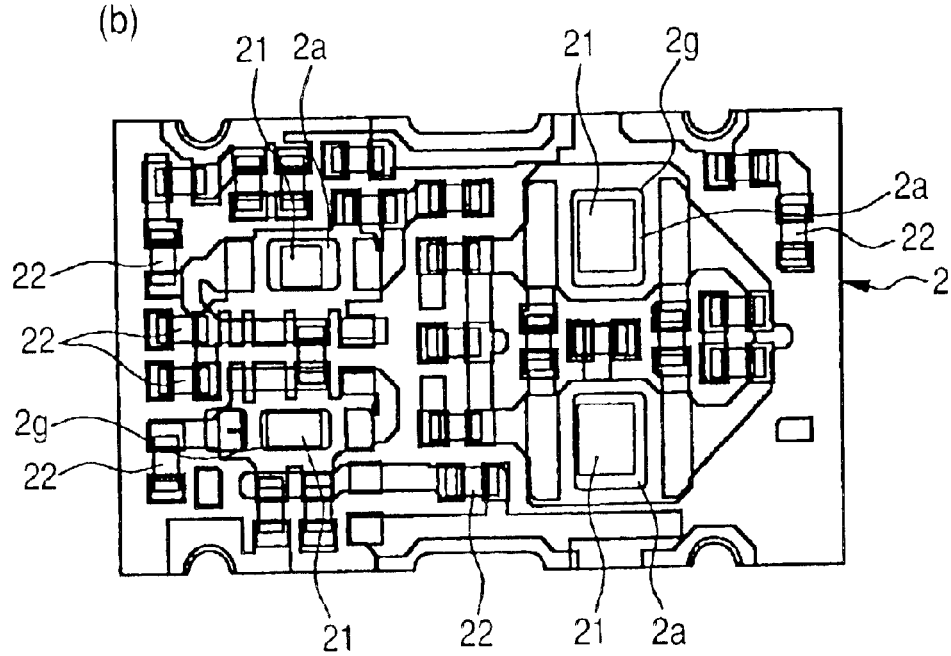

FIG. 17
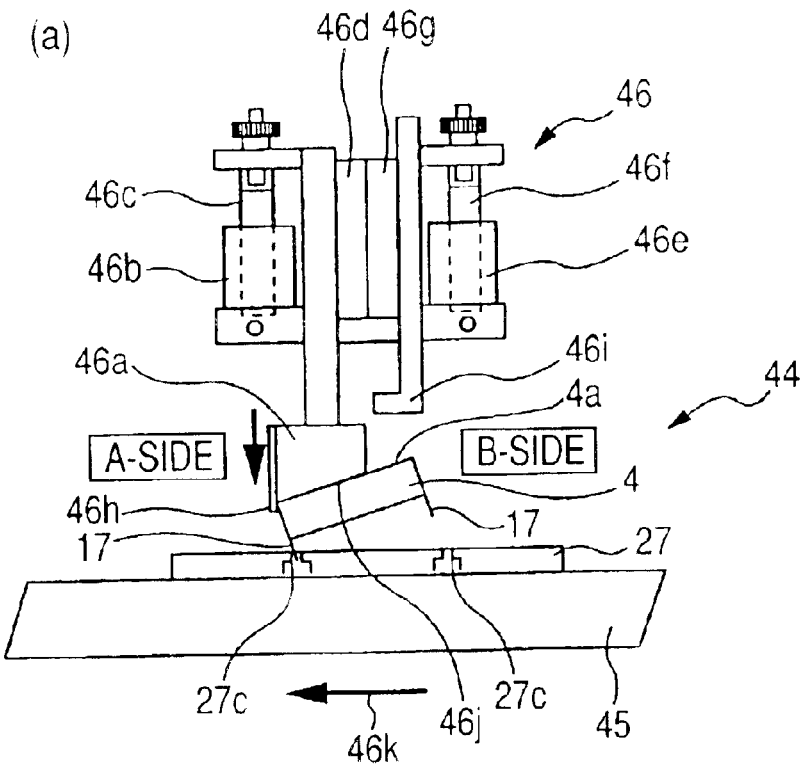
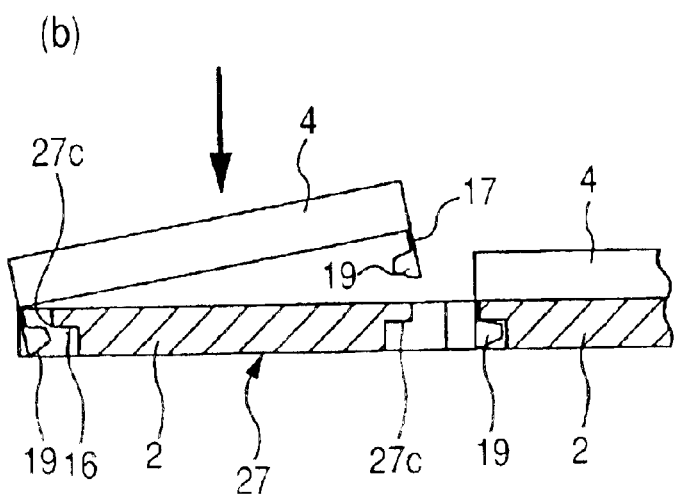

FIG. 19
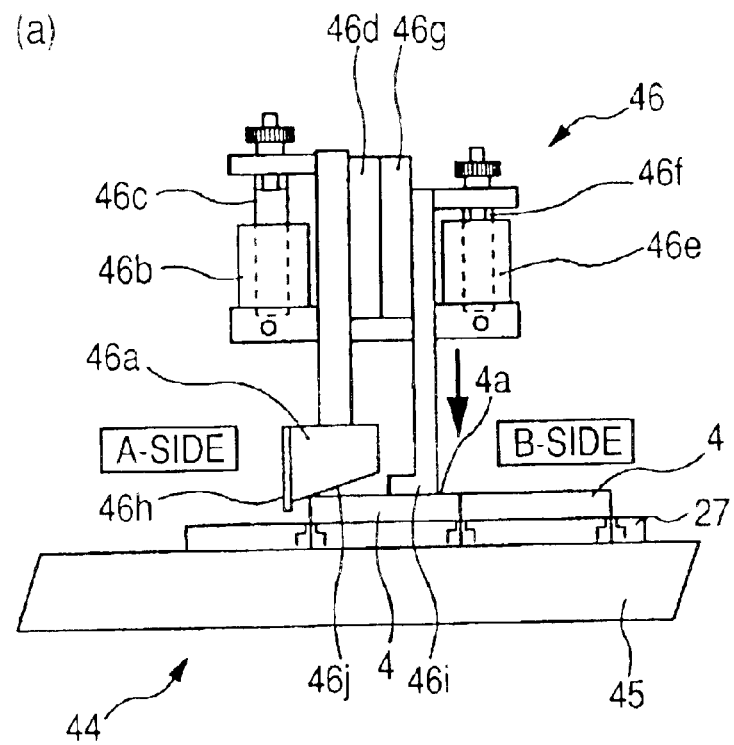
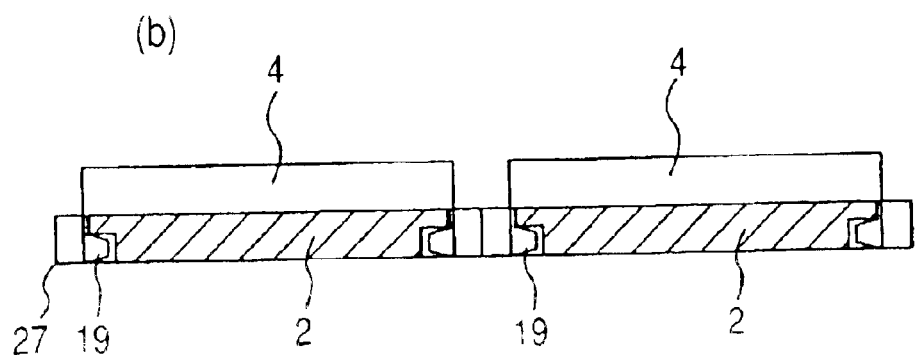

| GRADE NO. | CHARACTERISTICS OF SEMICONDUCTOR PELLETS |
|---|---|
| 3 | Ciss=39.5~50.3pf  Idss=0.0~3.6µA  Vth=0.54~0.57V |
| 4 | Ciss=39.5~50.3pf  Idss=0.0~3.6µA  Vth=0.51~0.54V |
| 5 | Ciss=39.5~50.3pf  Idss=0.0~3.6µA  Vth=0.48~0.51V |
| 6 | Ciss=39.5~50.3pf  Idss=0.0~3.6µA  Vth=0.45~0.48V |
| 7 | Ciss=39.5~50.3pf  Idss=0.0~3.6µA  Vth=0.42~0.45V |
| 8 | Ciss=39.5~50.3pf  Idss=0.0~3.6µA  Vth=0.39~0.42V |

FIG. 23
(a)
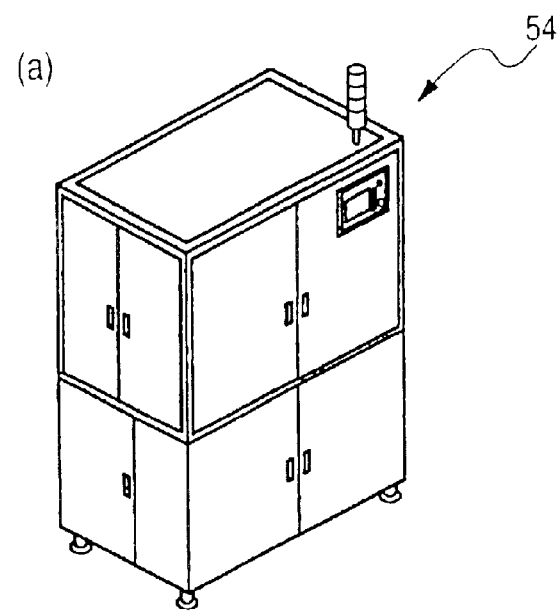
(b)
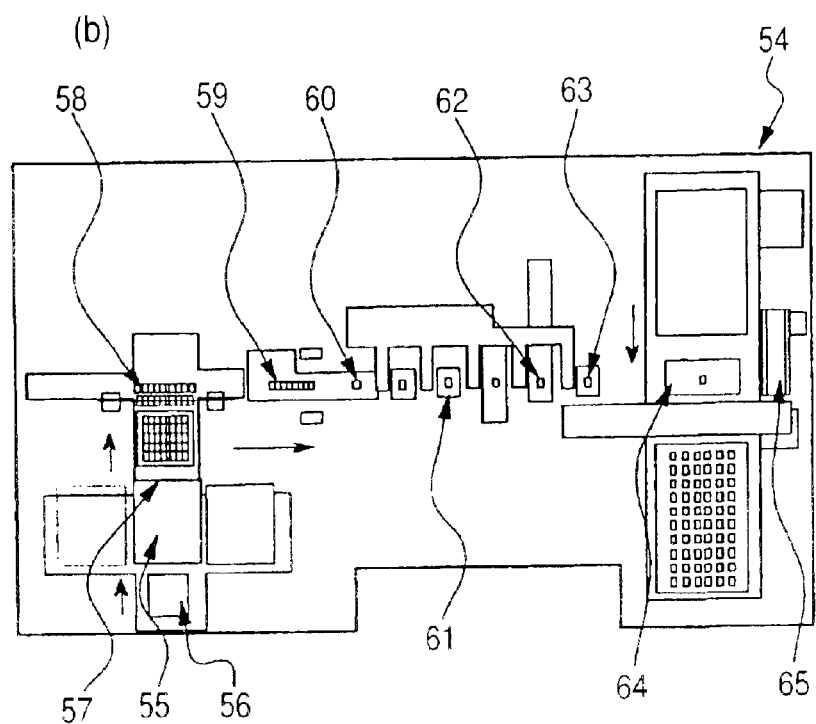

FIG. 28
(a)
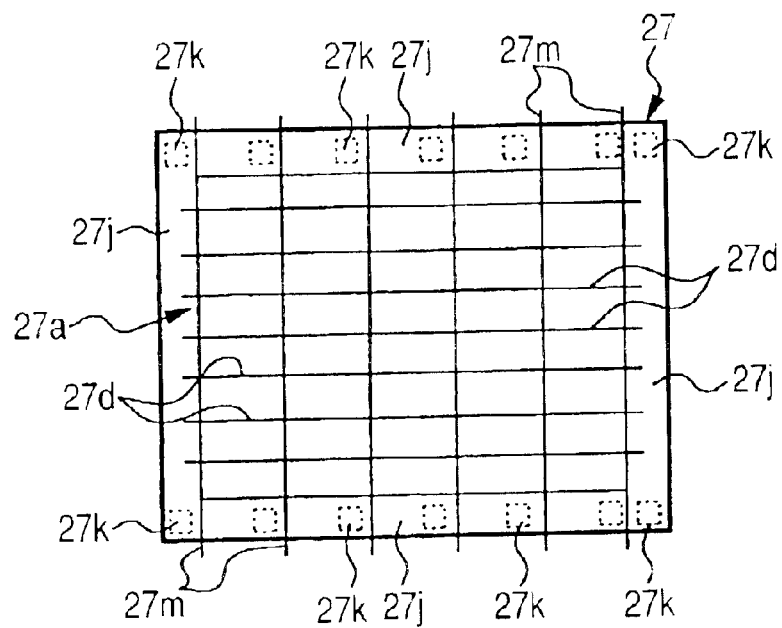
(b)
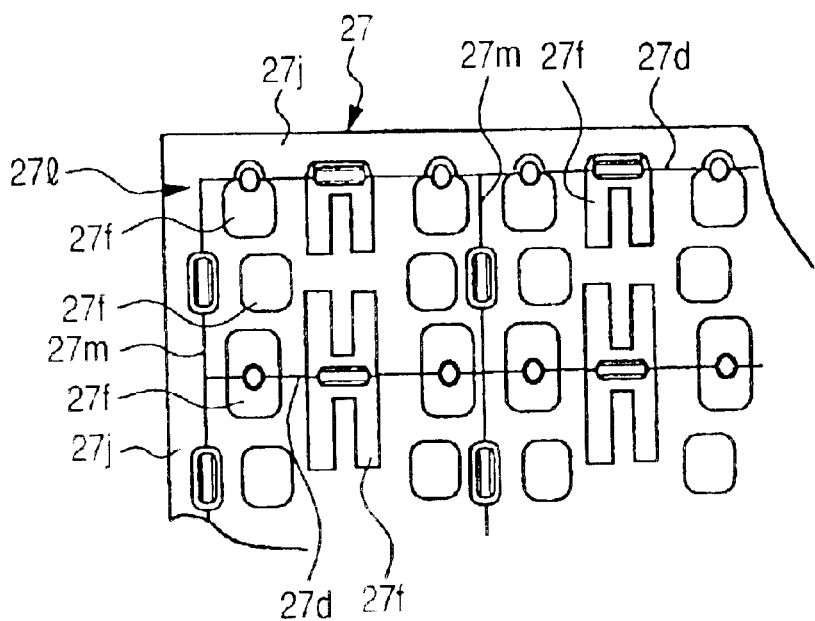

FIG. 30
(a) 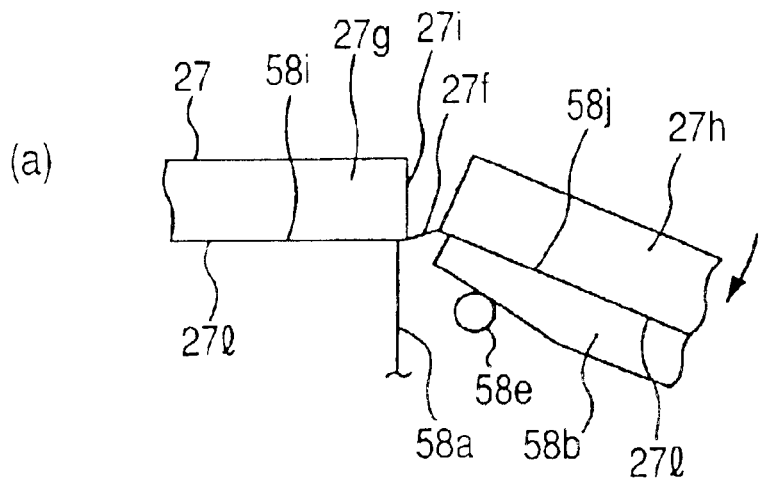
(b) 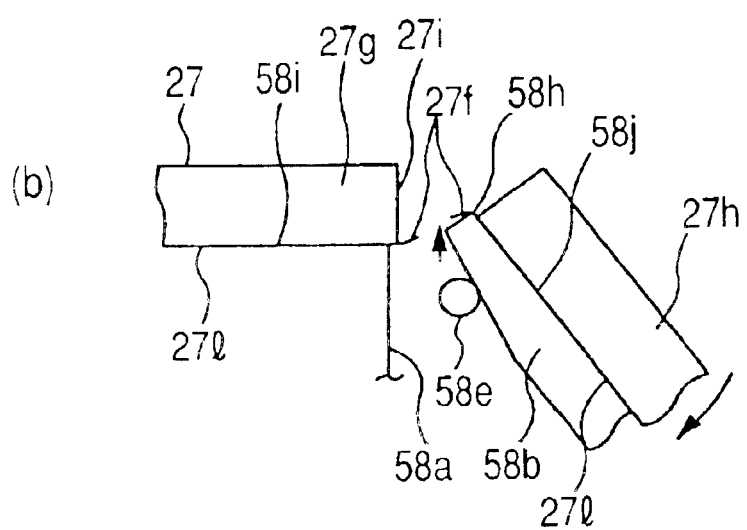

SEMICONDUCTOR DEVICE FABRICATION METHOD AND SEMICONDUCTOR DEVICE FABRICATION APPARATUS

TECHNICAL FIELD

The present invention relates to a semiconductor manufacturing technique and more particularly to a technique which is effectively applicable to a high-frequency module (a high-frequency power amplifier) manufacturing method and a semiconductor manufacturing apparatus used therein.

BACKGROUND ART

As to a high-frequency power amplifier called a high-frequency module (also called RF module or RF power module) on which are mounted surface-mounted type chip parts such as chip capacitor and chip resistor and also mounted bare chip-mounting semiconductor pellets, it is described, for example, in Japanese Unexamined Patent Publication No. Hei 10(1998)-12808 (Numanami). In this publication there are described a structure and electrical characteristics of a high-frequency module and a structure of a matrix substrate for assembling plural high-frequency modules at a time.

As to a cap mounting method in a hybrid IC (integrated circuit), a description thereof is found, for example, in Japanese Unexamined Patent Publication No. Hei 6(1994)-302707 (Morisumi et al.). In this publication there is described a method for mounting a cap to each of substrates obtained as individual pieces.

In the Publication No. Hei 10(1998)-12808, there is found no description on characters and symbols to be affixed to the cap. Further, the details of the cap mounting method for the matrix substrate and such assembling techniques as how to mount chip parts (electronic parts) and semiconductor pellets and how to perform solder printing and solder potting for the matrix substrate are not described therein.

In Japanese Unexamined Patent Publication No. Hei 6(1994)-302707 (Morisumi et al.) there is not described a cap mounting method for a matrix substrate.

As to a substrate dividing method, related techniques are described, for example, in Japanese Unexamined Patent Publication Nos. Hei 7(1995)-40296 (Shigekane et al.), Hei 5(1993)-24036 (Miyaki et al.), Hei 10(1998)-44138 (Moriwaki et al.), and Hei 5(1993)-124031 (Sekimoto et al.).

First, in the Unexamined Patent Application Nos. Hei 7(1995)-40296 there is described a technique wherein a rotational center of a substrate dividing portion in substrate division is set at an extending position in the depth direction of a substrate dividing groove to effect substrate division, thereby decreasing the occurrence of chipping on a ruptured face of each substrate.

In the Publication Hei 5(1993)-24036, there is described a technique wherein a cutter is disposed on an upper surface of an edge portion of a ceramic substrate and the cutter is brought into collision with the edge portion to make substrate division along a dividing groove.

In the Publication No. Hei 10(1998)-44138, there is described a technique wherein a paper strip-like substrate is fed while side faces thereof are clamped with rollers, thereby making substrate division without applying pressure to the substrate surface.

In the the Publication No. Hei 5(1993)-124031, there is described a technique wherein a ceramic substrate is aligned with a stopper, a force acting in a swing direction is applied to the substrate while holding substrate edges to make substrate division, thereby improving the dividing accuracy.

According to the above substrate dividing methods, however, in a matrix substrate having dividing grooves, if wiring patterns which span such dividing grooves are formed on the back side of the matrix substrate, the wiring patterns will not be cut completely even if a dividing portion in the matrix substrate is bent for division along the associated dividing groove, thus giving rise to the problem that the matrix substrate cannot be divided into a remaining portion and the dividing portion.

Further, if an attempt is made to tear off the wiring patterns simultaneously with substrate division while clamping strongly the remaining portion of the matrix substrate, it is required to enhance the clamping force, thus giving rise to the problem that the remaining portion of the matrix substrate, i.e., product, is damaged.

It is an object of the present invention to provide a semiconductor device manufacturing method which can decrease the number of manufacturing steps and rationalize the manufacturing line.

It is another object of the present invention to provide a semiconductor device manufacturing method which can reduce the manufacturing cost.

It is a further object of the present invention to provide a semiconductor device manufacturing method which can reduce the material cost.

It is a still further object of the present invention to provide a semiconductor device manufacturing method and apparatus which permit wiring patterns to be torn off simultaneously with the division of a matrix substrate without causing damage to products.

It is a still further object of the present invention to provide a semiconductor device manufacturing method and apparatus which can stabilize the division of a matrix substrate.

It is a still further object of the present invention to provide a semiconductor device manufacturing method and apparatus which can automate a matrix substrate dividing work to reduce the cost.

It is a still further object of the present invention to provide a semiconductor device manufacturing method and apparatus which can automate a matrix substrate dividing work to improve the quality of products.

It is a still further object of the present invention to provide a semiconductor device manufacturing method and apparatus which can automate a matrix substrate dividing work to shorten the processing time.

The above and other objects and novel features of the present invention will become apparent from the following description and the accompanying drawings.

DISCLOSURE OF THE INVENTION

A method of manufacturing a semiconductor device according to the present invention comprises the steps of disposing and mounting a chip for a passive element and a chip for an active element onto a wiring substrate and attaching a cap having a recognition mark on a surface thereof to the wiring substrate to cover the chip for a passive element and the chip for an active element.

A method of manufacturing a semiconductor device according to the present invention comprises the steps of disposing and mounting a chip for a passive element and a chip for an active element onto a wiring substrate, inspecting a recognition mark of a cap having the recognition mark on a surface thereof, and attaching the cap if found to be non-defective in the inspection to the wiring substrate to cover the chip for a passive element and the chip for an active element.

Since a non-defective cap is attached to the wiring substrate after inspecting the recognition mark affixed to the cap surface, it is possible to prevent mounting of a defective cap such as a mark-free cap, a cap with a defective mark, or a cap with another mark.

Thus, there is no fear that a cap defective with respect to its recognition mark may be attached to the wiring substrate. Consequently, it is possible to rationalize the manufacturing line.

A method of manufacturing a semiconductor device according to the present invention comprises the steps of mounting a chip for a passive element and a chip for an active element onto each of non-defective wiring substrates out of plural wiring substrates formed on a matrix substrate after inspection, and attaching a cap to each of the non-defective wiring substrates to cover the chip for a passive element and the chip for an active element.

By thus mounting a chip for a passive element and a chip for an active element on each of only non-defective wiring substrates formed on a matrix wiring substrate after inspection, it is possible to omit the mounting work for defective portions in the semiconductor device manufacturing process.

Thus, it is possible to reduce the number of manufacturing steps and rationalize the manufacturing line.

As a result, the semiconductor device manufacturing cost can be reduced.

A method of manufacturing a semiconductor device according to the present invention, wherein a chip for a passive element and a chip for an active element are mounted on a wiring substrate, comprises the steps of printing solder to a terminal for the chip for a passive element, thereafter applying solder by potting to a recess formed in the wiring substrate, disposing the chip for a passive element onto the wiring substrate, disposing the chip for an active element into the recess of the wiring substrate, and performing the reflow of solder to mount the chip for a passive element and the chip for an active element onto the wiring substrate by solder connection.

By printing solder to the terminal for the chip for a passive element on the wiring substrate and thereafter applying solder by potting to the recess formed in the wiring substrate, that is, since solder printing is performed first, it is possible to prevent a solder mask from being stained by solder during solder printing.

A method of manufacturing a semiconductor device according to the present invention, wherein a chip for a passive element and a chip for an active element are mounted on a wiring substrate, comprises the steps of disposing the chip for a passive element onto the wiring substrate, thereafter disposing the chip for an active element into the recess of the wiring substrate, and mounting the chip for a passive element and the chip for an active element on the wiring substrate by solder connection.

A method of manufacturing a semiconductor device according to the present invention, wherein a chip for a passive element and a chip for an active element are mounted on each of plural wiring substrates of a matrix substrate, comprises the steps of disposing the chip for a passive element onto each of the wiring substrates of the matrix substrate, the wiring substrates being partitioned by dividing grooves, disposing the chip for an active element into a recess formed in each of the wiring substrates, mounting the chip for a passive element and the chip for an active element on each of the wiring substrates by solder connection, and applying a sealing resin to the recess of each of the wiring substrates by potting while avoiding the dividing grooves to seal the chip for an active element with the resin.

A method of manufacturing a semiconductor device according to the present invention, wherein a chip for a passive element and a chip for an active element are mounted on each of plural wiring substrates of a matrix substrate, comprises the steps of disposing and mounting the chip for a passive element and the chip for an active element onto each of the wiring substrates of the matrix substrate, and inserting one of opposed hook support portions of each of caps into a corresponding one of hook holes obliquely which hook holes are formed in the matrix substrate, the hook support portions respectively supporting hooks which are engageable with each of the wiring substrates, to mount the caps to the matrix substrate, allowing the chip for a passive element and the chip for an active element on each of the wiring substrates of the matrix substrate to be covered with each the caps.

A method of manufacturing a semiconductor device according to the present invention, wherein a chip for a passive element and a chip for an active element are mounted on a wiring substrate, comprises the steps of disposing the chip for a passive element onto a selected wiring substrate as the wiring substrate, disposing a selected chip for an active element as the chip for an active element into a recess formed in the selected wiring substrate, and mounting both chips for passive and active elements respectively on the selected wiring substrate by solder connection, the selected wiring substrate and the selected chip for an active element being mounted in combination with each other so that characteristics of the semiconductor device fall under an allowable range.

In a method of manufacturing a semiconductor device according to the present invention, a matrix substrate having wiring patterns formed on a second main surface thereof in a manner spanning dividing grooves is divided along the dividing grooves, the second main surface being located on the side opposite to a first main surface of the matrix substrate on which the dividing grooves to partition plural wiring substrates of the matrix substrate are formed, the method comprising the steps of causing a dividing portion contiguous to a remaining portion of the matrix substrate to project and supporting the remaining portion by the second main surface, with plural caps being attached to the main surface of the matrix substrate correspondingly to the wiring substrates, and causing the dividing portion of the matrix substrate to pivot to the second main surface side to divide the remaining portion and the dividing portion from each other and tearing off the wiring pattern concerned along the associated dividing grooves.

Even in the case of a matrix substrate with dividing grooves and caps formed on a main surface thereof, wiring patterns can be torn off smoothly along the dividing grooves by pivoting and dividing the dividing portion of the matrix substrate to the second main surface side.

Thus, even a matrix substrate with caps attached thereto can be divided into individual wiring substrates without damage to products.

In a method of manufacturing a semiconductor device according to the present invention, a matrix substrate having wiring patterns formed on a second main surface thereof in a manner spanning dividing grooves is divided along the dividing grooves, the second main surface being located on the side opposite to a first main surface of the matrix substrate on which the dividing grooves to partition plural wiring substrates of the matrix substrate are formed, the method comprising the steps of causing a dividing portion contiguous to a remaining portion of the matrix substrate to project and supporting the remaining portion by the second main surface, displacing a pivot center in both a direction perpendicular to the second main surface from a dividing position where any of the dividing grooves is formed and a direction of the dividing portion from the dividing position, the pivot center being a center of pivoting the dividing portion of the matrix substrate to the second main surface side, allowing the dividing portion to pivot in this state to divide the remaining portion and the dividing portion from each other, and tearing off the wiring pattern concerned along the associated dividing groove.

By displacing the pivot center in both a direction perpendicular to the second main surface from the dividing position of the matrix substrate and a direction of the dividing portion from the dividing position, the pivot center being a center of pivoting the dividing portion to the second main surface side, it is possible to impart a pulling force to the dividing portion for the wiring patterns after substrate division.

Thus, after substrate division, a pulling force can be exerted on the wiring patterns by a series of associated operations, with the result that both substrate division and tearing-off of the wiring pattern can be done stably and automatically without causing any damage to products.

Consequently, it becomes possible to automate the matrix substrate dividing work and hence possible to reduce the working cost. As a result, the cost of the semiconductor device can be reduced.

Besides, since the substrate division under the same conditions can be done by automating the matrix substrate dividing work, it is possible to improve the product quality.

Further, since the speed of the matrix substrate dividing work can be made high by automating the same work, it is possible to improve the throughput of the dividing process.

In a method of manufacturing a semiconductor device according to the present invention, a matrix substrate having wiring patterns formed on a second main surface thereof in a manner spanning dividing grooves is divided along the dividing grooves, the second main surface being located on the side opposite to a first main surface of the matrix substrate on which the dividing grooves to partition plural wiring substrates of the matrix substrate are formed, the method comprising the steps of causing a dividing portion contiguous to a remaining portion of the matrix substrate to project and supporting the remaining portion by the second main surface, and dividing the matrix substrate into the remaining portion and the dividing portion and thereafter tearing off the wiring pattern concerned along the associated dividing groove.

By dividing the matrix substrate into the remaining portion and the dividing portion and thereafter tearing off the wiring patterns, both substrate division and tearing-off of the wiring pattern can be done by a series of operations.

As a result, it is possible to stabilize the substrate dividing work.

In a method of manufacturing a semiconductor device according to the present invention, a matrix substrate having wiring patterns on a second main surface thereof in a manner spanning dividing grooves is divided along the dividing grooves, the second main surface being located on the side opposite to a first main surface of the matrix substrate on which the dividing grooves to partition plural wiring substrates of the matrix substrate are formed, the method comprising the steps of causing a dividing portion contiguous to a remaining portion of the matrix substrate to project and supporting the remaining portion by the second main surface, and when dividing the matrix substrate into the remaining portion and the dividing portion along the associated dividing groove, beginning the dividing work with one end of the dividing groove.

By beginning the matrix substrate dividing work with one end of the associated dividing groove it is possible to divide the matrix substrate cleanly and smoothly.

In a fabrication apparatus for a semiconductor device according to the present invention, in a substrate dividing section there are provided a dividing support base for allowing a remaining portion of a matrix substrate to be supported by a second main surface of the matrix substrate in a projected state of a dividing portion of the matrix substrate, the dividing portion being contiguous to the remaining portion, and a movable portion disposed pivotably so as to displace a pivot center in both a direction perpendicular to the second main surface from a dividing position where a dividing groove is formed and a direction of the dividing portion from the dividing position, the pivot center being a center of pivoting the dividing portion supported by the dividing support base to the second main surface side, wherein the dividing portion of the matrix substrate is pivoted to the second main surface side to divide the matrix substrate along the dividing groove.

Other inventions involved in the present invention will be outlined below.

1. A method of manufacturing a semiconductor device, wherein a matrix substrate having wiring patterns formed on a second main surface thereof in a manner spanning dividing grooves is divided along the dividing grooves, the second main surface being located on the side opposite to a first main surface of the matrix substrate on which the dividing grooves to partition plural wiring substrates of the matrix substrate are formed, the method comprising the steps of:

(a) mounting a surface-mounted type electronic component and a bare chip-mountable semiconductor pellet onto each of the wiring substrates;

(b) causing a dividing portion contiguous to a remaining portion of the matrix substrate to project and supporting the remaining portion by the second main surface; and (c) pivoting the dividing portion of the matrix substrate while displacing a pivot center in both a direction perpendicular to the second main surface from a dividing position where any of the dividing grooves is formed and a direction of the dividing portion from the dividing position, the pivot center being a center of pivoting the dividing portion to the second main surface side, to divide the remaining portion and the dividing portion from each other, and thereafter tearing off the wiring pattern concerned along the associated dividing groove.

2. A method of manufacturing a semiconductor device, wherein a matrix substrate having wiring patterns formed on a second main surface thereof in a manner spanning dividing grooves is divided along the dividing grooves, the second main surface being located on the side opposite to a first main surface of the matrix substrate on which the dividing grooves to partition plural wiring substrates of the matrix substrate are formed, the method comprising the steps of:

(a) mounting a surface-mounted type electronic component and a bare chip-mountable semiconductor pellet onto each of the wiring substrates;

(b) causing a dividing portion contiguous to a remaining portion of the matrix substrate to project and supporting the remaining portion by the second main surface; and (c) pivoting the dividing portion of the matrix substrate while displacing a pivot center in both a direction perpendicular to the second main surface from a dividing position where any of the dividing grooves is formed and a direction of the dividing portion from the dividing position, the pivot center being a center of pivoting the dividing portion to the second main surface side, to divide the remaining portion and the dividing portion from each other, beginning with one end of the dividing groove, and tearing off the wiring pattern concerned along the associated dividing groove.

3. A method of manufacturing a semiconductor device, wherein a matrix substrate having wiring patterns formed on a second main surface thereof in a manner spanning dividing grooves is divided along the dividing grooves, the second main surface being located on the side opposite to a first main surface of the matrix substrate on which the dividing grooves to partition plural wiring substrates of the matrix substrate are formed, the method comprising the steps of:

(a) mounting a surface-mounted type electronic component and a bare chip-mountable semiconductor pellet onto each of the wiring substrates;

(b) disposing the matrix substrate onto a dividing support base in a substrate dividing apparatus;

(c) causing a dividing portion contiguous to a remaining portion of the matrix substrate to project and supporting the second main surface of the remaining portion by the dividing support base; and (d) pivoting the dividing portion of the matrix substrate to the second main surface side, applying a load to one end of the first main surface of the dividing portion, the application of the load being performed by a loading portion, the loading portion capable of being interlocked with a movable portion of the dividing support base correspondingly to the first main surface of the dividing portion, to divide the remaining portion and the dividing portion from each other, beginning with the one end of the dividing groove, and tearing off the wiring pattern concerned along the associated dividing groove.

BRIEF DESCRIPTION OF THE DRAWINGS

FIGS. 1(a) and 1(b) show structural examples of a high-frequency module assembled by the semiconductor device manufacturing method according to the present invention, in which FIG. 1(a) is a perspective view and FIG. 1(b) is a sectional view;

FIGS. 5(a) to 5(d) show structural examples of a matrix substrate used in manufacturing the high-frequency module shown in FIG. 1 and a wiring substrate with a defect mark affixed thereto, in which FIG. 5(a) is a perspective view of the matrix substrate, FIG. 5(b) is a plan view of a defect-marked wiring substrate in parts mounting inspection, FIG. 5(c) is a plan view the defect-marked wiring substrate after reflow, and FIG. 5(d) is a plan view of the defect-marked wiring substrate after wire bonding;

FIGS. 6(a) and 6(b) show examples of a moving trace of a nozzle in a solder potting step which is carried out in the semiconductor device manufacturing method according to the present invention, in which FIG. 6(a) is a plan view showing a moving trace on a wiring substrate and FIG. 6(b) is a perspective view showing a moving trace on a matrix substrate;

FIGS. 7(a) to 7(c) show structural examples of a substrate used in a solder printing step and a solder potting step which are carried out in the semiconductor device manufacturing method according to the present invention, in which FIG. 7(a) is a plan view of a matrix substrate before the formation of solder, FIG. 7(b) is a plan view of a wiring substrate before the formation of solder, and FIG. 7(c) is a plan view of the wiring substrate after solder printing and solder potting;

FIGS. 8(a) and 8(b) show structural examples of a parts mounting apparatus used in a parts mounting process which is carried out in the semiconductor device manufacturing method according to the present invention, in which FIG. 8(a) is a perspective view showing an appearance of the device and FIG. 8(b) is a constructional block diagram;

FIGS. 9(a) and 9(b) show structural examples of a pellet mounting apparatus used in a pellet mounting step which is carried out in the semiconductor device manufacturing method according to the present invention, in which FIG. 9(a) is a perspective view showing an example of the device and FIG. 9(b) is a constructional block diagram;

FIGS. 10(a) and 10(b) show structural examples of a wiring substrate used in the parts mounting step and the pellet mounting step which are carried out in the semiconductor device manufacturing method according to the present invention, in which FIG. 10(a) is a plan view of the wiring substrate after parts mounting and FIG. 10(b) is a plan view of the wiring substrate after pellet mounting;

FIGS. 11(a) and 11(b) show structural examples of a substrate in parts position inspection which is performed in an automatic visual inspection step in the semiconductor device manufacturing method according to the present invention, in which FIG. 11(a) is a plan view of a matrix substrate and FIG. 11(b) is a plan view of a wiring substrate;

FIGS. 12(a) and 12(b) show structural examples of a substrate in a resin coating step which is carried out in the semiconductor device manufacturing method according to the present invention, in which FIG. 12(a) is a plan view of a matrix substrate and FIG. 12(b) is a plan view of a wiring substrate;

FIGS. 13(a) to 13(c) show structural examples of a cap used in a cap inserting step which is carried out in the semiconductor device manufacturing method according to the present invention, in which FIG. 13(a) is a plan view and FIGS. 13(b) and 13(c) are side views;

FIGS. 15(a) and 15(b) show examples of a hook hole recognizing method for recognizing hook holes formed in a matrix substrate in the cap inserting step which is carried out in the semiconductor device manufacturing method according to the present invention, in which FIG. 15(a) is a front view showing a state of recognition and FIG. 15(b) is a plan view showing a hook hole formed in a matrix substrate;

FIGS. 17(a) and 17(b) show examples of how to insert a cap in the cap inserting step which is carried out in the semiconductor manufacturing method according to the present invention, in which FIG. 17(a) shows a principle of the insertion and FIG. 17(b) shows in what state the cap is inserted;

FIGS. 18(a) to 18(c) show examples of how to mount a cap in the cap inserting step which is carried out in the semiconductor manufacturing method according to the present invention, in which FIG. 18(a) shows a principle of the mounting, FIG. 18(b) is an enlarged sectional view of the cap shown in 18(a), and FIG. 18(c) is an enlarged, partial sectional view of portion C shown in 18(b);

FIGS. 19(a) and 19(b) show examples of a state after cap insertion in the cap inserting step which is carried out in the semiconductor device manufacturing method according to the present invention, in which FIG. 19(a) is a front view and FIG. 19(b) is an enlarged, partial sectional view of a wiring substrate;

FIGS. 23(a) and 23(b) show structural examples of a substrate dividing apparatus used in a substrate dividing step which is carried out in the semiconductor device manufacturing method according to the present invention, in which FIG. 23(a) is a perspective view showing an appearance of the device and FIG. 23(b) is a constructional block diagram;

FIGS. 26(a) to 26(c) show structural examples of a matrix substrate used in manufacturing the high-frequency module shown in FIG. 1 and a wiring substrate formed thereon, in which FIG. 26(a) is a perspective view of the matrix substrate, FIG. 26(b) is a perspective view of the wiring substrate, and FIG. 26(c) is a plan view of the wiring substrate;

FIGS. 28(a) and 28(b) show structural examples of a matrix substrate just before substrate division in assembling the high-frequency module shown in FIG. 1, in which FIG. 28(a) is a plan view and FIG. 28(b) is a partially enlarged bottom view;

FIGS. 30(a) and 30(b) show details of the division principle in the substrate dividing method illustrated in FIG. 29, in which FIG. 30(a) is a principle diagram showing substrate division and FIG. 30(b) is a principle diagram showing in what manner a wiring pattern is torn off;

BEST MODE FOR CARRYING OUT THE INVENTION

Figure 1:
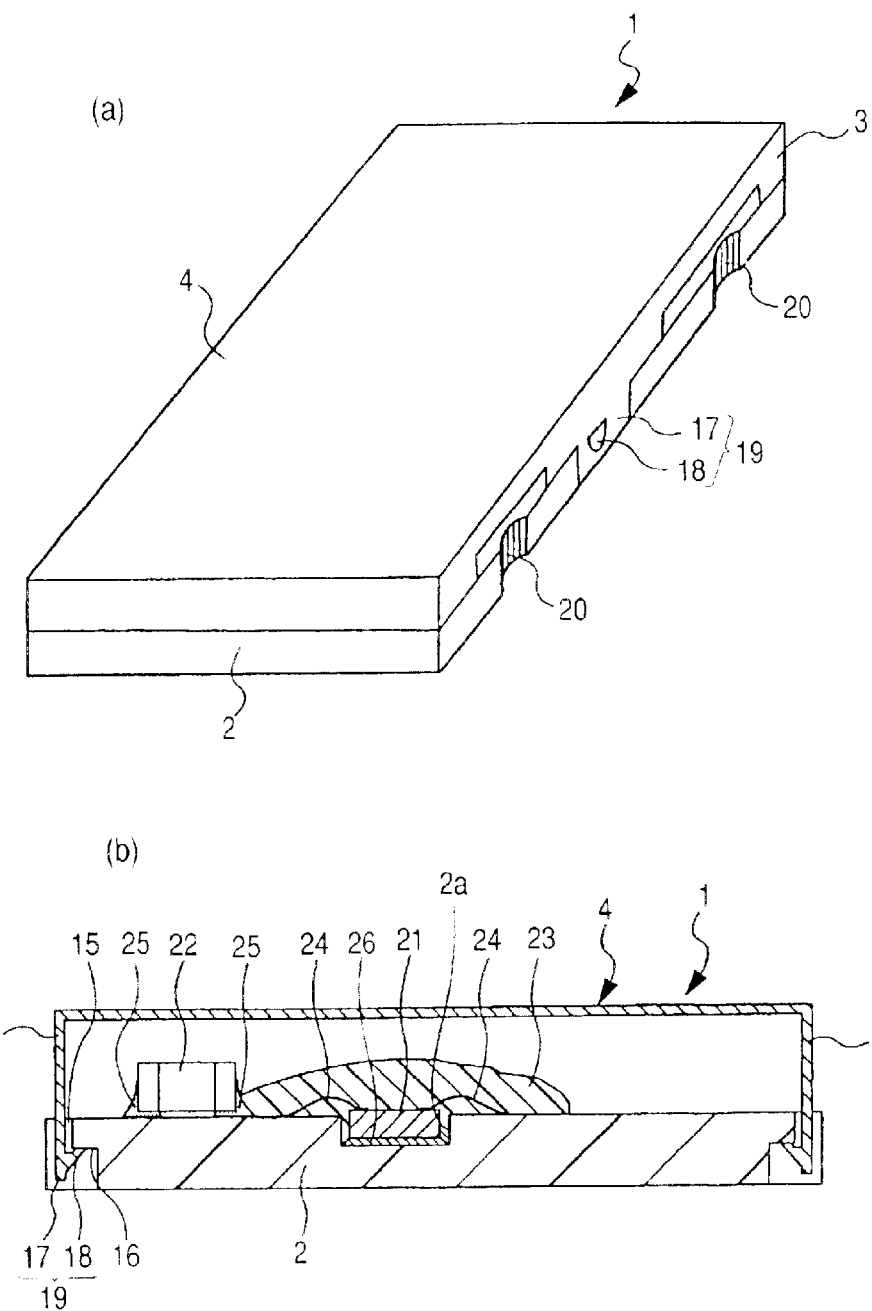

In the following embodiments, explanations of the same or similar portions will not be repeated in principle except when particularly required.

In the following embodiments, plural inventions will be described by way of three embodiments for the sake of convenience, but it goes without saying that the steps to be described below are not always essential to all of the inventions, unless otherwise mentioned.

In the following embodiments, when necessary for convenience' sake, an explanation will be given in a divided manner into plural sections or examples, but unless otherwise mentioned, they are not unrelated to each other, but are in such a relation as one being a modification or a detailed supplementary explanation of a part or the whole of the other.

In the following embodiments, when reference is made to, for example, the number of elements (including the number of elements, numerical value, amount, and range), no limitation is made to a specific number referred to, but there also may be adopted numbers larger and smaller than the specific number unless otherwise mentioned and except when limitation to the specific number is clear basically.

In the following embodiments, it goes without saying that components thereof (including component steps) are not always essential, unless otherwise mentioned and except when the components are clearly considered essential basically.

Further, in the following examples, when reference is made to the shape, a positional relation, etc. of components, etc., it is to be understood that those which are substantially similar or closely similar to the shape, etc. are also included, unless otherwise mentioned and except when a negative answer is clear basically. This is also the case with the above numerical value and range.

Embodiments of the present invention will be described hereinunder with reference to the accompanying drawings. In all of the drawings for illustration of the embodiments, members having the same functions will be identified by like reference numerals and repeated explanations thereof will be omitted.

Figure 4:
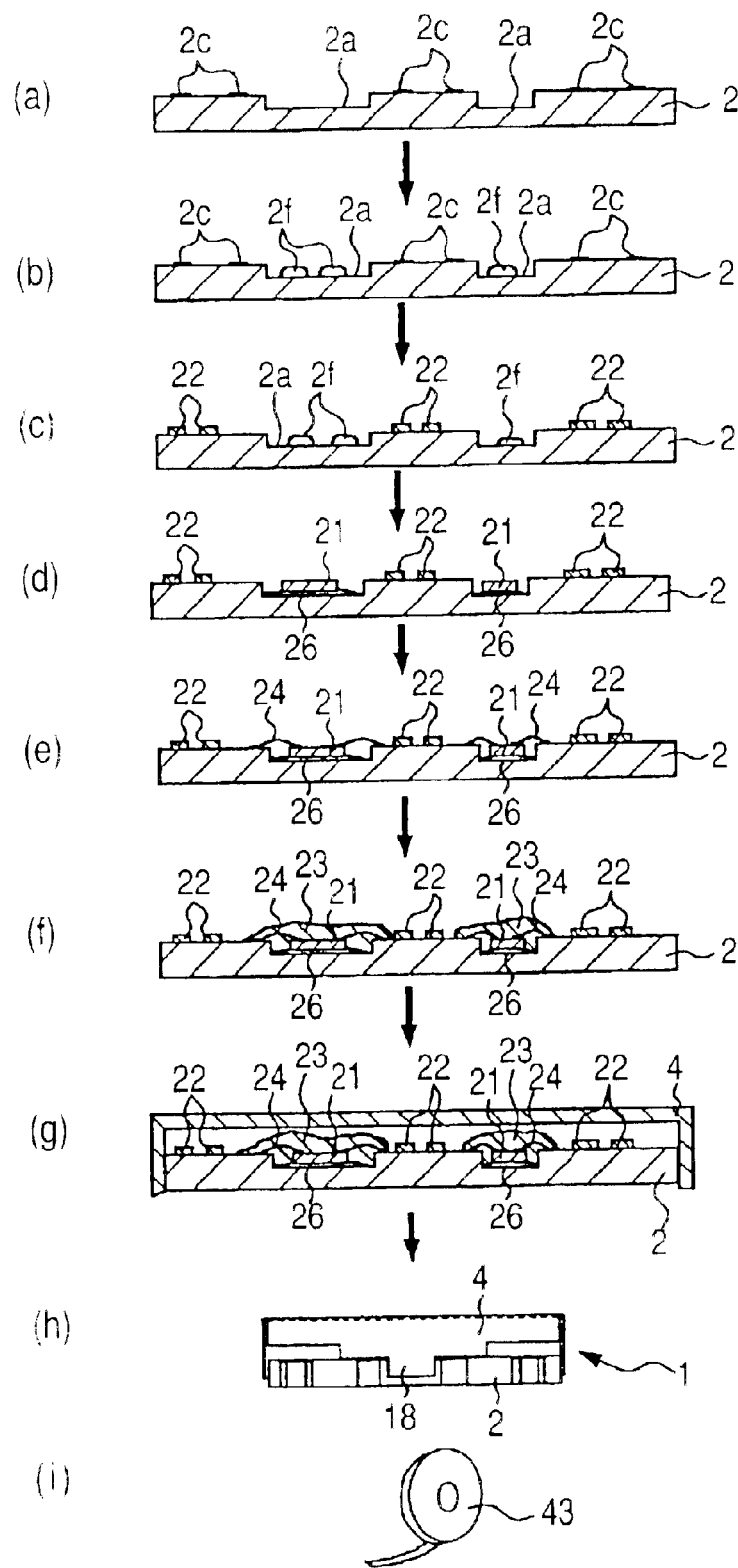
FIGS. 4(a), 4(b), 4(c), 4(d), 4(e), 4(f), 4(g), 4(h), and 4(i) are sectional, side, and perspective views showing a structural example of a wiring substrate and a high-frequency module corresponding to each of main steps illustrated in FIG. 3.
Figure 5:
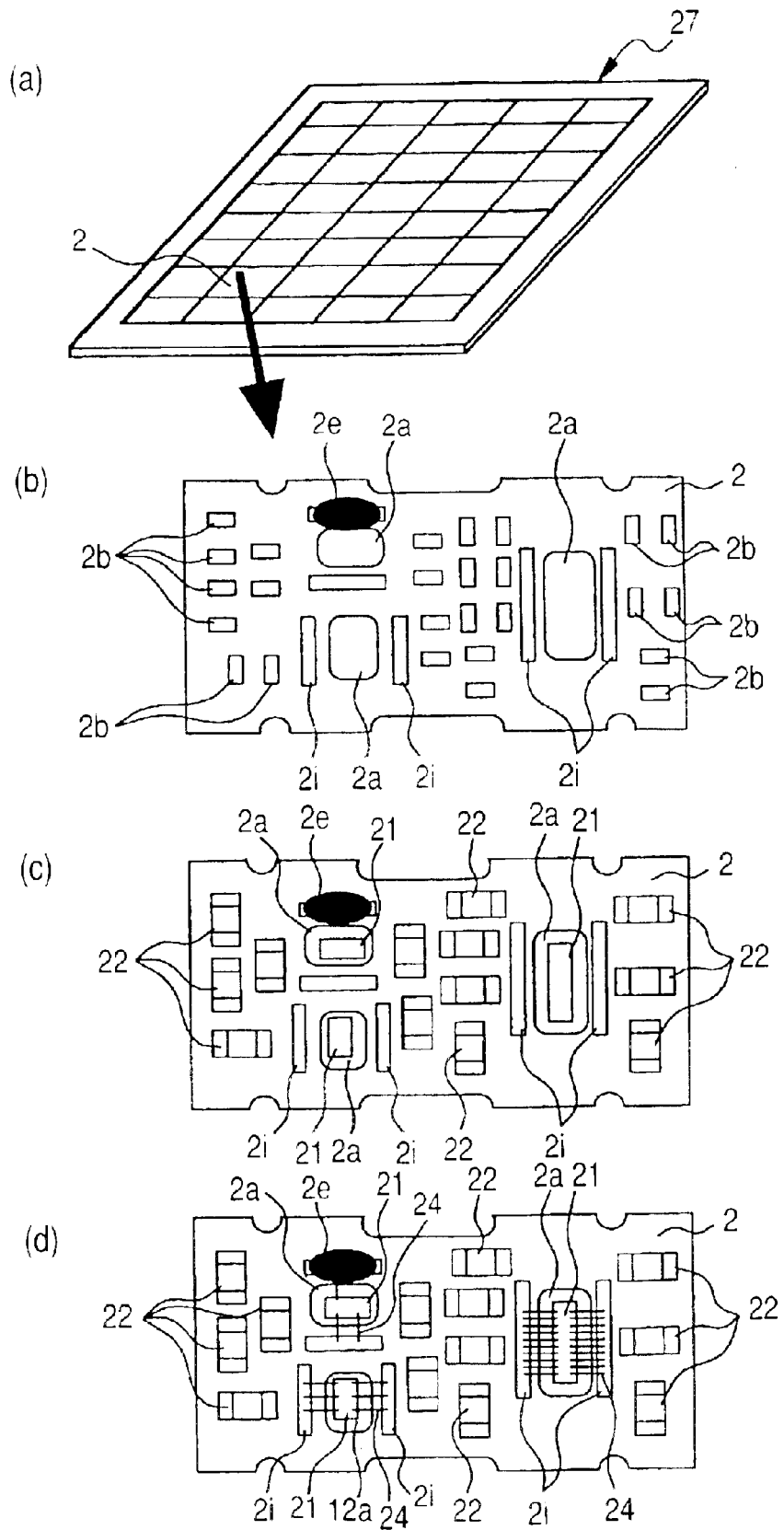

A first embodiment of the present invention will now be described with reference to FIGS. 1 and 2 which illustrate the structure of a semiconductor device (a high-frequency module 1), FIG. 3 which illustrates an assembling procedure for the high-frequency module 1, FIG. 4 which is a sectional view of a wiring substrate for each of main steps, and FIG. 5 which illustrates a defect-marked wiring substrate.

Figure 2:
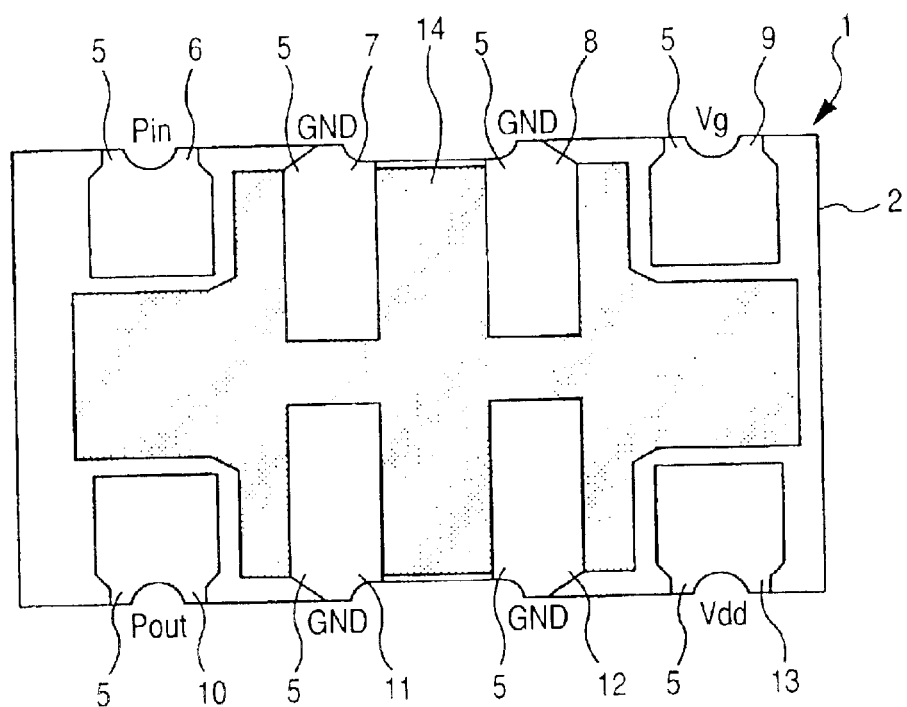
FIG. 2 is a bottom view thereof.

A semiconductor device assembled by a semiconductor device manufacturing method according to a first embodiment of the present invention illustrated in FIGS. 1 and 2 is a high-frequency power amplifier called a high-frequency module 1 (also called an RF power module), in which a cap 4 is superimposed on a main surface (upper surface) of a plate-like wiring substrate 2. In appearance, it has a flat rectangular structure.

Therefore, the high-frequency module 1 is mainly built into a small-sized portable electronic device or the like such as a portable telephone. In the high-frequency module 1, semiconductor pellets 21 (chips for active elements) as bare chip-mounting active parts with field effect transistors formed thereon and chip parts 22 (chips for passive elements) which are not only electronic parts (surface-mounted or -attached parts) such as surface-mounted type chip capacitor and chip resistor but also passive parts, are mounted (mixed) on a wiring substrate 2.

In the high-frequency module 1, as shown in FIG. 1(a), a cap 4 is positioned so that outer edges thereof coincide with or are inside outer edges of the wiring substrate 2. The cap 4 is formed by draw-forming a metallic plate into a rectangular box shape having side walls 3 which project along outer edges of a lower surface of the cap.

As shown in FIG. 1(b), the cap 4 has opposed hook support arms (hook support portions) 17 projecting downward from central positions of both opposite side walls 3. At an inside position of a lower end portion of each hook support art 17 is formed a hook pawl 17 also by forming. A hook 19 as a retaining portion having elasticity is formed by both hook pawl 18 and hook support arm 17.

For example, the cap 4, which is 0.1 mm or so in thickness, is formed using an unplated nickel silver (nickel-copper-zinc alloy) or a nickel-plated phosphor bronze to enhance the wettability thereof for solder.

In central positions on both opposed sides of the wiring board 2 are formed recesses 15 for disposition therein of the hook support arms 17 respectively. The bottom of each recess 15 is further recessed to form an engaging portion 16 and the pawl 18 of each hook 19 is brought into engagement with the engaging portion 16.

With the recess 15 formed, once the hook pawl 18 is put in engagement with the engaging portion 16, there is no fear that the hook support arm 17 may project outside the recess 15.

Besides, since the hook support arm 17 is formed by a metallic plate, it is possible to exert an elastic force on the hook 19. Thus, when the side walls 3 of the cap 4 come into contact with the main surface of the wiring substrate 2 and the hook pawls 18 are engaged elastically with the back side of the wiring substrate, the cap 4 can be fixed firmly to the wiring substrate 2.

At this time, since the hooks 19 exert an elastic force on the wiring substrate 2, it is also possible to remove the cap 4 easily.

As to the retaining structure between the wiring substrate 2 and the cap 4, there may be adopted another structure.

As shown in FIG. 2, on the back side of the wiring substrate 2 are provided plural external terminals 5. The external substrates 5 are arranged at approximately equal intervals on both sides in the longitudinal direction of the back of the wiring substrate 2. In one row (the upper row in FIG. 2) there are provided, successively from left to right, an input terminal (Pin) 6, a ground terminal (GND) 7, a ground terminal (GND) 8, and a gate bias terminal (Vg) 9, while in the other row (the lower row in FIG. 2) there are provided, successively from let to right, an output terminal (Pout) 10, a ground terminal (GND) 11, a ground terminal (GND) 12, and a power terminal (Vdd) 13.

In side face positions of the wiring substrate 2 corresponding to the input terminal 6, gate bias terminal 9, output terminal 10, and power terminal 13 there are formed end-face through holes 20 extending from the surface to the back of the wiring substrate 2. When mounting the high-frequency module 1 to a mounting substrate such as a printed wiring substrate, the external terminals 5 are connected with electrode portions on the back side of the wiring substrate 2 through the end-face through holes 20, so that the high-frequency module 1 can be mounted firmly.

On the back side of the wiring substrate 2 and in an area where the four ground terminals 7, 8, 11, and 12 extend in a partitionwise manner, there is formed a resist film 14 using a material which is not wet by a bonding material (solder, for example) used for mounting the high-frequency module 1.

In the high-frequency module 1, as shown in FIG. 1(b), the chip parts 22 are mounted on the surface of the wiring substrate 2 and the semiconductor pellets 21 are mounted through solder connections 26 into recesses 2a formed as cavities in the surface of the wiring substrate 2.

Further, the chip parts 22 are soldered through solder fillet 25 to electrodes 2b (terminals for passive element chips) for chip parts shown in FIG. 5(b). As to the semiconductor pellets 21, pads as surface electrodes thereof are connected to substrate-side terminals 2i of the wiring substrate 2 through wires 24 such as gold wires.

The semiconductor pellets 21 and the wires 24 are sealed with sealing resin 23 such as epoxy resin.

The high-frequency module 1 is, for example, 8 mm wide, 12.3 mm long, and 1.8 mm high.

Next, an outline of how to manufacture the high-frequency module 1 (semiconductor device) according to the first embodiment, as well as an explanation of a defect mark 2e affixed to the wiring substrate 2, will be given below with reference to FIGS. 1 to 5.

Figure 3:
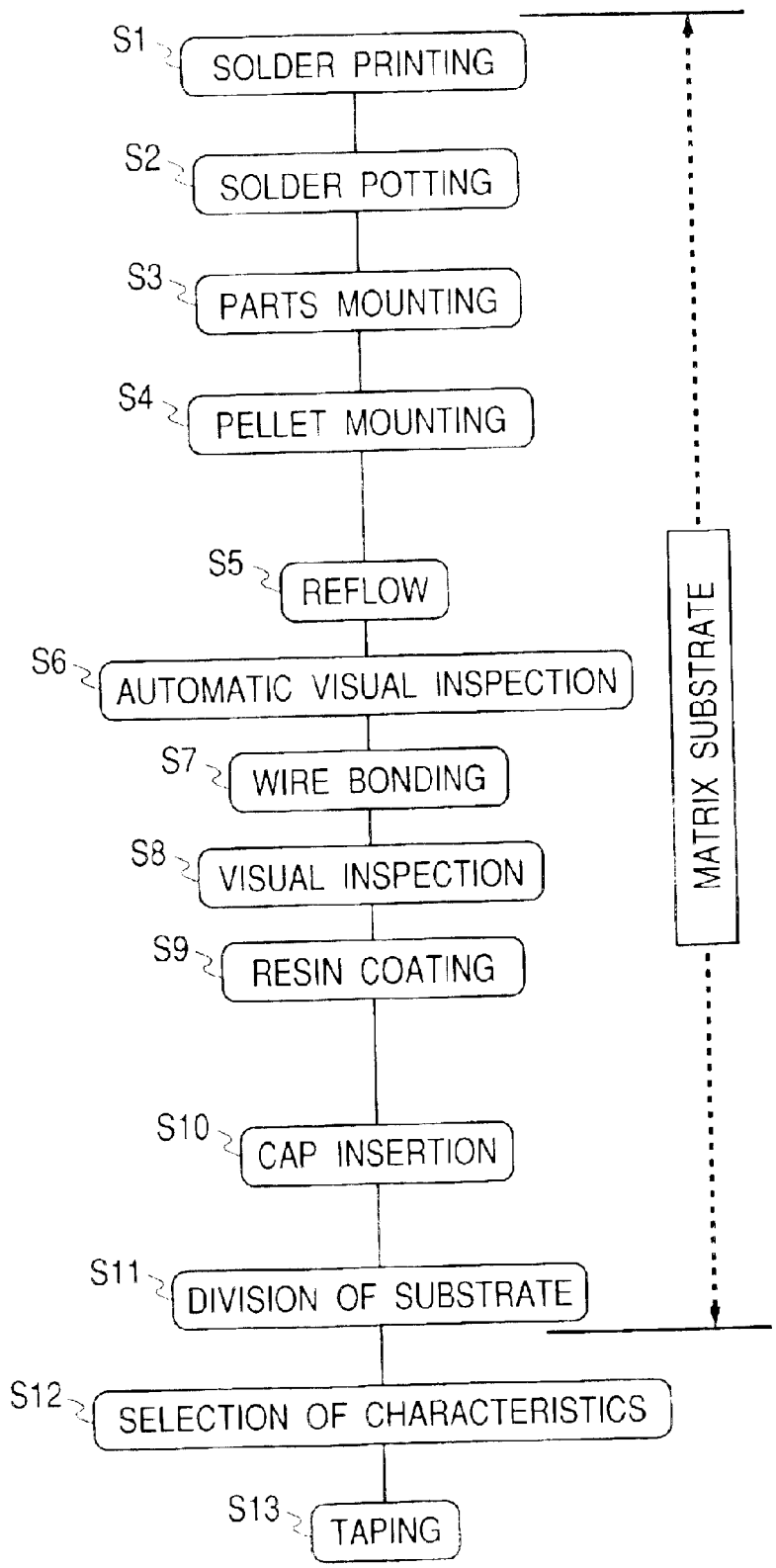
FIG. 3 is a flow chart of a manufacturing process, showing an example of an assembling procedure adopted in the method for manufacturing the high-frequency module shown in FIG. 1.

The high-frequency module 1 is assembled in accordance with an assembling procedure (manufacturing process) shown in FIG. 3. The assembling procedure comprises the steps of solder printing for chip parts mounting (step S1, FIG. 4(a)), solder potting for mounting semiconductor pellets (step S2, FIG. 4(b)), parts mounting for mounting the chip parts 22 (Step S3, FIG. 4(c)), pellet mounting for mounting the semiconductor pellets 21 (step S4, FIG. 4(d)), reflow of solder (incl. washing (step S5)), automatic visual inspection after reflow (step S6), wire bonding (step S7, FIG. 4(e)), visual inspection after wire bonding (step S8), resin coating for the application of sealing resin 23 (step S9, FIG. 4(f)), cap insertion (incl. marking (step S10), dig. 4(g)), division of substrate for dividing a matrix substrate 27 into individual wiring substrates 2 (step S11), selection of characteristics of the high-frequency module 1 (step S12, FIG. 4(h)), and taping of the high-frequency module 1 (step S13, FIG. 4(i)).

The solder printing step S1 to the cap insertion step S10 (incl. marking) are carried out in the state of the matrix substrate 27 with plural wiring substrates 2 formed thereon. Thereafter, in step S11 the matrix substrate 27 is divided into individual wiring substrates 2. Thus, the selection of characteristics in step S12 and the taping of step S13 are carried out in the form of the high-frequency module 1 having an individual wiring substrate 2.

By thus manufacturing the high-frequency module 1 without dividing the matrix substrate 27 until the final stage of the module assembling process, it is possible to reduce the module manufacturing cost and the material cost. Besides, the assembling work can be done smoothly and it is possible to rationalize the manufacturing line.

As to detailed contents of operations performed respectively in the assembling steps, reference will be made thereto later in a second embodiment of the present invention.

In this first embodiment, the high-frequency module 1 is assembled by the following method which is characteristic throughout the whole of the high-frequency module manufacturing process.

First, chip parts 22 and semiconductor pellets 21 are disposed on each of only inspection-passed wiring substrates on the matrix substrate 27 shown in FIG. 5(a). Thus, the chip parts 22 and the semiconductor pellets 21 are disposed on only non-defective wiring substrates 2. That is, in the cap inserting step S10, the cap 4 is attached to only each non-defective wiring substrate 2.

More specifically, such a defect mark 2e as shown in FIG. 5(a) is affixed to a block, i.e., wiring substrate 2, which is judged to be defective in a delivery (purchasing) stage inspection of wiring substrates 2 on the matrix substrate 27 (it is optional whether this inspection is to be done beforehand on the substrate manufacturer's side and inspected substrates are delivered, or the inspection is to be done after the delivery of substrates). Then, in a series of steps which follow (from parts mounting of step S3 to the cap insertion of step S10) the defect mark 2e is recognized and operation is omitted for a wiring substrate 2 with the defect mark 2e formed thereon.

By so doing it is possible to reduce the manufacturing steps for the high-frequency module 1 and rationalize the manufacturing line.

As a result, the cost of manufacturing the high-frequency module 1 can be reduced.

As examples of substrate defects at the matrix substrate delivery stage are mentioned electrical defects such as short-circuit and opening of circuit caused by breaking of wire, as well as appearance defects such as substrate warping and appearance short.

As to the defect mark 2e, for example a marking ink for semiconductor which does not dissolve even under washing after soldering and which facilitates pattern recognition is applied to a defective wiring substrate, followed by baking, to form the defect mark 2e.

Likewise, inspection is performed after the end of each assembling step to recognize an intra-step defective wiring substrate 2 and the defect mark 2e is affixed thereto. The step which follows is not performed for the wiring substrate 2 (intra-step defective substrate) with the defect mark 2e thus affixed thereto.

For example, as shown in FIG. 5(b), as to the wiring pattern 2 with the defect mark 2e affixed thereto, the defect mark 2e is detected by pattern recognition in the parts mounting step S3 shown in FIG. 3 and the chip parts 2 are not mounted on the wiring substrate as a defective block.

Likewise, also in the pellet mounting step S4 the defect mark 2e is detected by pattern recognition and the semiconductor pellets 21 are not mounted on the wiring substrate 2 found to be defective.

Further, in the automatic visual inspection of step S6 after the mounting of parts and pellets, the defective mark 24 is detected by pattern recognition and the associated wiring substrate is counted as a defective substrate without performing inspection. At this time, as to the block (wiring substrate 2) judged to be defective in the automatic visual inspection, the defect mark 2e is applied thereto by coating or the like with use of a quick-drying ink, as shown in FIG. 5(c).

Also in the wire bonding step S7 the defect mark 2e put on delivery and the defective mark 2e put on visual inspection after the mounting of parts and pellets are detected by pattern recognition and wire bonding is not performed for wiring substrates 2 as defective blocks.

In visual inspection of step S8 after the wire bonding, the defective mark 2e is affixed to a wiring substrate 2 judged to be defective in appearance after wire bonding, for example by coating with use of a quick-drying ink, as shown in FIG. 5(d).

In the resin coating step S9, the defective marks 2e put on delivery, on visual inspection after the mounting of parts and pellets, and on visual inspection after wire bonding, are detected by pattern recognition and resin coating is not performed for wiring substrates as defective blocks.

Similarly, also in the cap inserting step S10 the defective marks 2e put on delivery, on visual inspection after the mounting of parts and pellets, and on visual inspection after wire bonding, are detected by pattern recognition and the cap is not attached to any of wiring substrates 2 as defective blocks.

Further, in the substrate dividing step S11, whether the cap 4 is present or not is detected by means of a sensor or the like and wiring substrates 2 with cap 4 are judged to be non-defective and are stored, while wiring substrates 2 without cap 4 are discharged as defective substrates.

Thus, the work of the next step can be omitted with respect to defective blocks (wiring substrates 2), so that it is possible to reduce the number of manufacturing steps in manufacturing the high-frequency module 1 and rationalize the manufacturing line. As a result, the manufacturing cost of the high-frequency module 1 can be decreased.

The matrix substrate 27 is, for example, a ceramic substrate of multi-layer interconnection. As an example, if forty wiring substrates 20 are formed thereon, the size of the matrix substrate 27 is 78.75 mm×75.00 mm. The matrix substrate 27 may be, for example, a glass fabric-based epoxy resin substrate other than the ceramic substrate.

Next, a second embodiment of the present invention will be described below with reference to FIGS. 1 to 22.

In this second embodiment the operations of the assembling steps will be described in detail in accordance with the assembling procedure (manufacturing process flow) for the high-frequency module 1 shown in FIG. 3.

As shown in FIG. 5(b), on the surface of each wiring substrate 2 of the matrix substrate 27 there are formed one or plural recesses 2a for mounting semiconductor pellets and electrodes 2b for mounting chip parts in accordance with the number of bare chip mounting semiconductor pellets 21 and chip parts 22. The electrodes 2b for chip parts are connected through various surface wires 2d, as shown in FIG. 7(b).

First, solder printing of step S1 is performed for the matrix substrate 27 shown in FIG. 7(a).

In this case, solder printing is applied to the electrodes 2b (see FIG. 5(b)) for chip parts formed on a surface 27a of each wiring substrate 2 shown in FIG. 7(b) of the matrix substrate 27 to form such printed solder patterns 2c as shown in FIGS. 4(a) and 7(c).

For example, the solder printing is a screen printing using a solder mask.

After the solder printing, the solder potting of step S2 is performed.

In this step, solder is applied by potting to the recesses 2a formed in each wiring substrate 2 of the matrix substrate 27 to form potting solders 2f as shown in FIG. 4(b) and 7(c).

Figure 6:
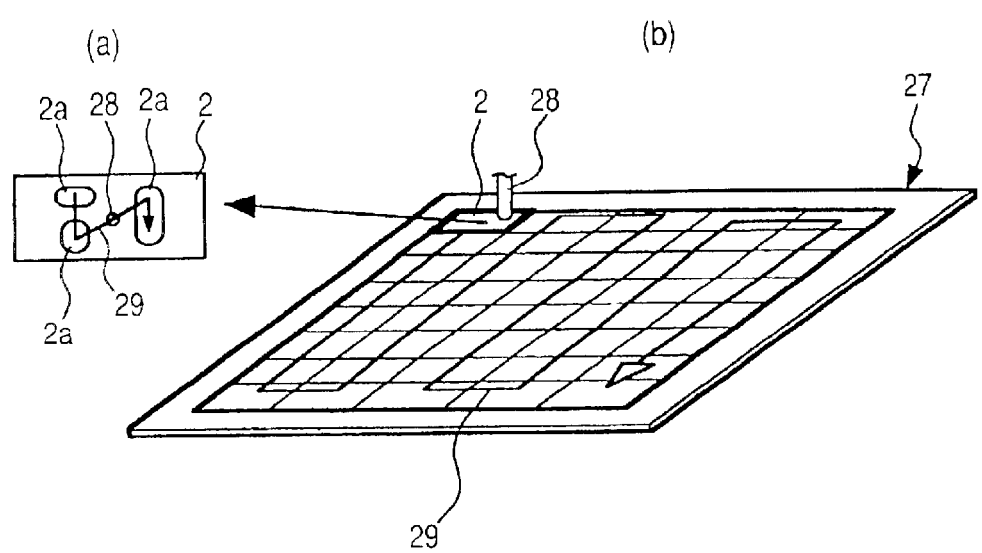
Figure 7:
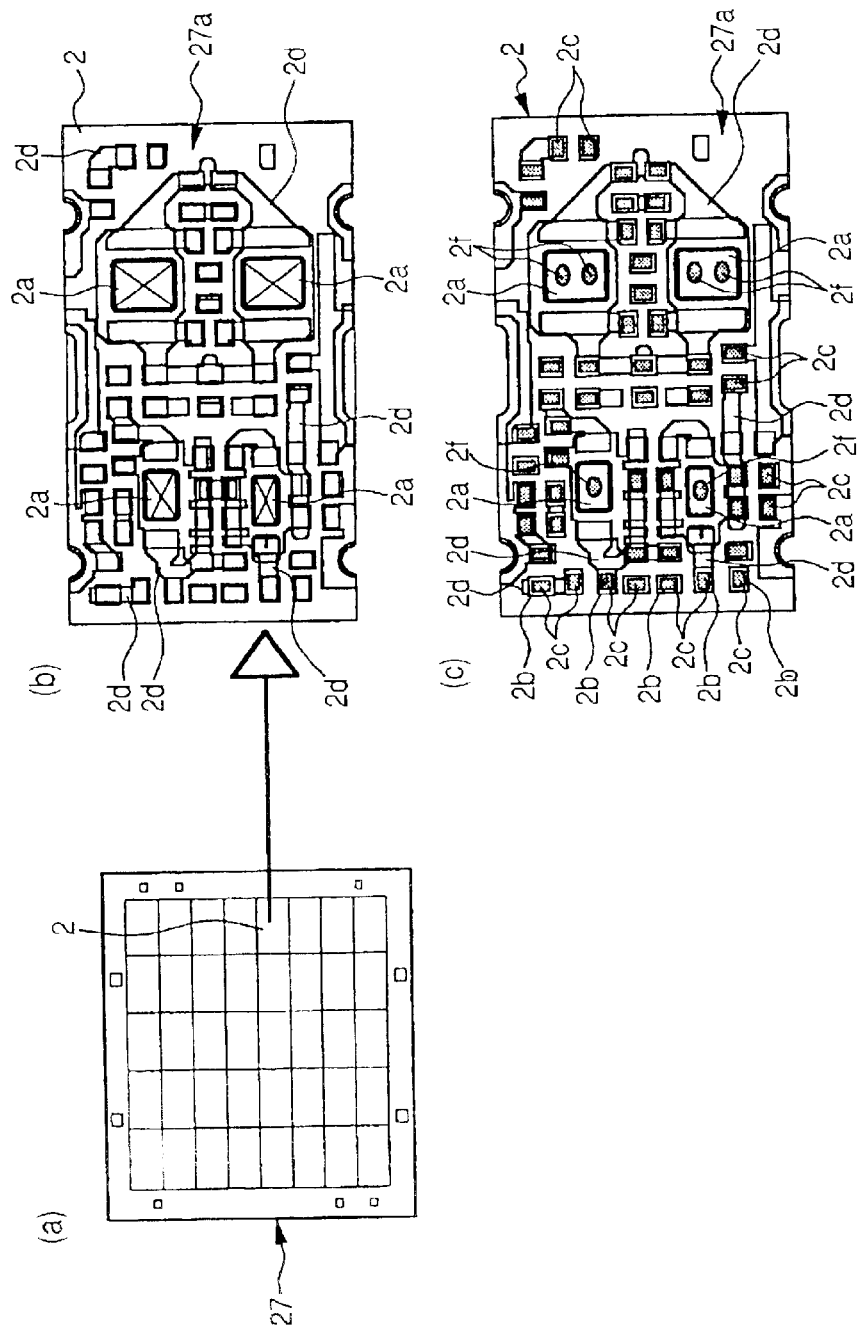
Figure 8:
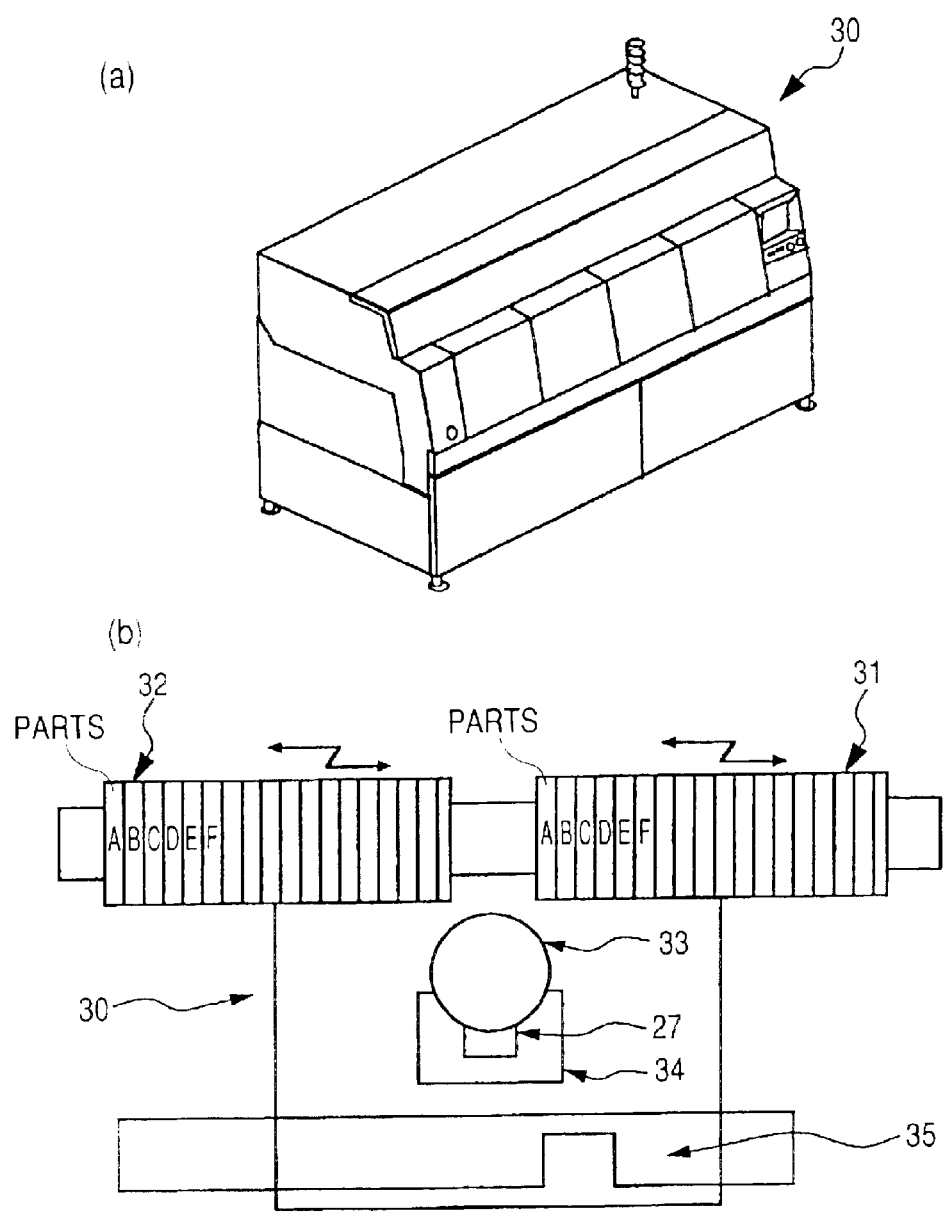
Figure 9:
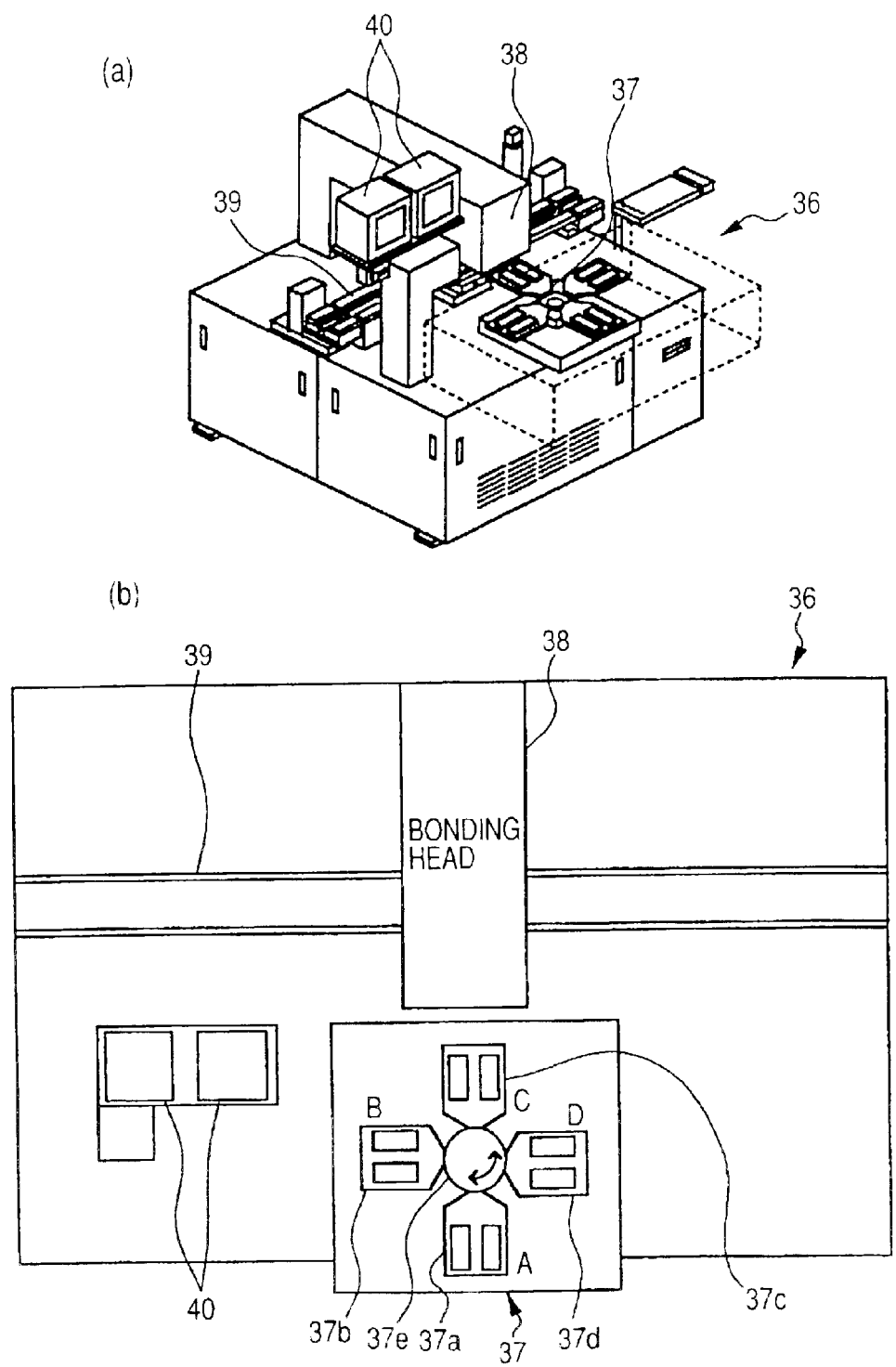
Figure 11:
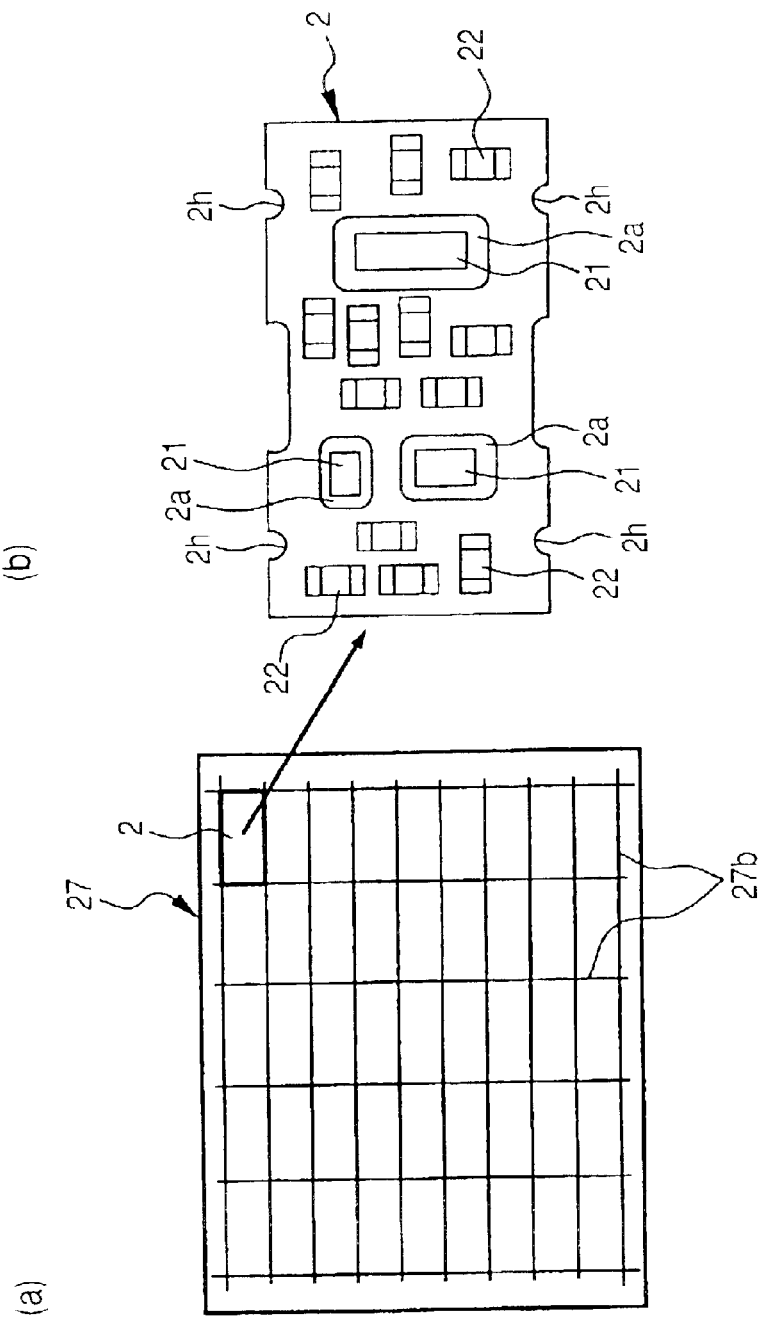
Figure 12:
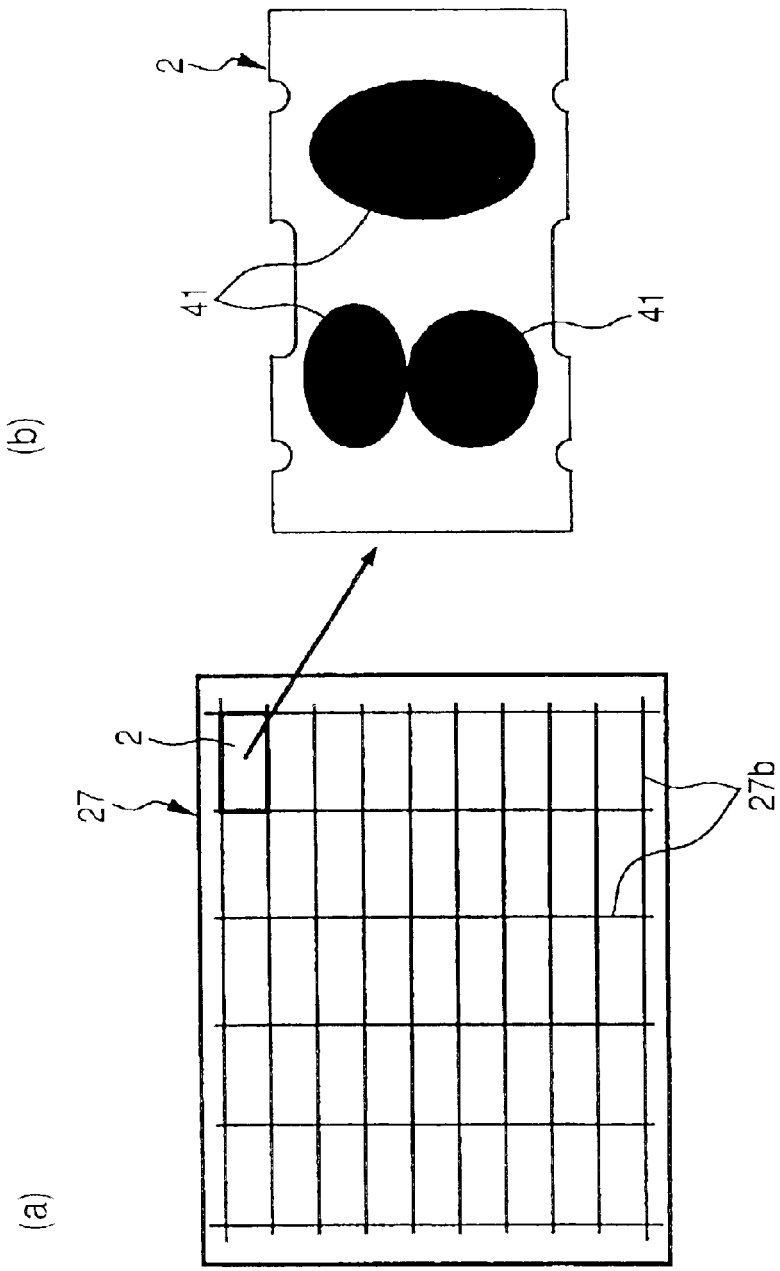

As shown in FIG. 6, there is described a moving trace 29 of a nozzle 28 when solder is discharged from a solder potting nozzle 28. More specifically, the nozzle 28 is moved at a shortest distance by a continuous motion (one-stroke motion) between adjacent recesses 2a in a wiring substrate 2 on a single matrix substrate 27, as shown in FIG. 6(a), and at the same time the nozzle 28 is moved at the shortest distance by a continuous operation (one-stroke motion) also for another adjacent wiring substrate 2 on the matrix substrate 27, as shown in FIG. 6(b).

Control of the moving trace 29 of the nozzle 28 is performed in accordance with a mounting position coordinates program.

In this second embodiment, first solder (printed solder patters 2c) is printed to the electrodes 2b for chip parts on the wiring substrate 2 and thereafter solder is applied by potting to the recesses 2a formed in the wiring substrate. Thus, since solder printing is performed first, the solder mask used in solder printing can be prevented from being stained by the potting solder.

Besides, since the nozzle 28 is moved at the shortest distance during solder potting with the nozzle, it is possible to shorten the potting time and hence possible to improve the throughput of the solder potting step.

Thereafter, the parts mounting step S3 shown in FIG. 3 is performed, followed by mounting of pellets in step S4.

The following description is now provided about the construction of a parts mounting apparatus 30 shown in FIG. 8(a) which is used in the parts mounting step.

The parts mounting apparatus 30 transfers and mounts the chip parts 22 onto each wiring substrate 2 of the matrix substrate 27. As shown in FIG. 8(b), the parts mounting device 30 comprises a first parts supply section 31 (parts supply section) and a second parts supply section 32 (parts supply section) both able to send out stored chip parts 22 (see FIG. 5(c)) kind by kind (type by type for example), an XY stage 34 which supports the matrix substrate 27, a mounting head 33 which for mounting chip parts 22 on the XY stage 34, and a substrate conveying section 35 for conveying the matrix substrate 27.

The first and second parts supply sections 31, 32 are, for example, tape feeders or bulk feeders and are installed slidably in a direction horizontal to a substrate conveying direction in the substrate conveying section 35.

Therefore, at the time of mounting the chip parts 22 in the parts mounting apparatus 30, the chip parts 22 (parts A, B, C, D, E, and F) stored in the first and second parts supply sections 31, 32 are fed and disposed onto each wiring substrate 2 in the unit of parts supply sections.

In this way the chip parts 22 are mounted on the wiring substrate 2, as shown in FIGS. 4(c) and 10(a).

For example, first all the chip parts 22 stored in the first parts supply section are mounted on the matrix substrate 27 and thereafter all the chip parts 22 stored in the second parts supply section are mounted on the matrix substrate 27.

By so doing it is possible to shorten the moving distance of both first and second parts supply sections 31, 32, with the result that the throughput of the parts mounting time can be improved.

If a certain type of chip parts 22 are stored in the first parts supply section 31, while another type of chip parts 22 are stored in the second parts supply section, it becomes possible to mount parts type by type.

At the time of mounting the chip parts 22, the printed solder patterns 2c formed on the electrodes 2b for chip parts on the wiring substrate 2 are recognized and chip parts 22 are disposed on the printed solder patterns 2c.

With this arrangement, during the reflow of solder, terminals of the chip parts 22 and the chip parts electrodes 2b are soldered to each other firmly through the printed solder patterns 2c by virtue of a self-alignment effect of the printed solder patterns 2c, so that even if the printed solder patterns 2c are formed offset from the electrodes 2b for chip parts, it is possible to prevent the occurrence of such defects as parts rise and parts float which are apt to occur on that occasion.

Next, a description will be given below about a pellet mounting apparatus 36 shown in FIG. 9(a) which device is used in the pellet mounting step S4.

The pellet mounting apparatus 36 transfers and mounts the semiconductor pellets 21 into the recesses 2 formed in each wiring substrate 2 of the matrix substrate 27. As shown in FIG. 9(b), the pellet mounting apparatus 36 comprises a pellet supply system 37 which can send out stored semiconductor pellets 21 kind by kind (type by type for example), a bonding head 38 for mounting the semiconductor pellets 21, a substrate conveying section 39 for the conveyance of the matrix substrate 27, and a monitor 40 which displays a bonding position, etc.

In the pellet supply system 37 there are provided, for example, four parts supply portions which are first, second, third, and fourth pellet supply portions 37a, 37b, 37c, 37d. These parts supply portion, which are chip trays for example, are attached to a rotary block 37e in the pellet supply system 37. In the pellet mounting apparatus 36, the semiconductor pellets 21 are mounted, for example, in accordance with a direct pickup method of directly picking up pellets from each pellet supply portion such as a chip tray or from semiconductor wafers.

Therefore, for the mounting of semiconductor pellets 21 in the pellet supply system 37 of the pellet mounting apparatus 36, the semiconductor pellets (pellets A, B, C, and D) stored respectively in the first to fourth pellet supply portions 37a, 37b, 37c, 37d are supplied to each wiring substrate 2 in the unit of parts supply portions.

In this way the semiconductor pellets 21 are mounted respectively in the recesses 2a of the wiring substrate 2, as shown in FIGS. 4(d) and 10(b).

For example, all of the semiconductor pellets 21 in the first pellet supply portion 37a are mounted on the whole of the matrix substrate 27, thereafter, the rotary block 37e is rotated and all of the semiconductor pellets 21 in the second pellet supply portion 37b are mounted on the whole of the matrix substrate 27. Further, the rotary block 37e is rotated and the semiconductor pellets 21 in the third and fourth pellet supply portions 37c, 37d are successively mounted on the whole of the matrix substrate 27.

According to this method the moving distance of the first to fourth pellet supply portions 37a, 37b, 37c, 37d can be shortened, so that the throughput of the pellet mounting time can be improved.

If semiconductor pellets 21 of different types or different grades are stored in the pellet supply portions, it becomes possible to effect the mounting of pellets type by type or grade by grade.

In mounting the semiconductor pellets 21, edge portions 2g of the recesses 2a formed in each wiring substrate 2 and shown in FIG. 10(b) are recognized and the pellets 21 are disposed in the recesses 2a.

By so doing, it is possible to improve the position recognizing accuracy for the recesses 2a and hence it is possible to set the size of each recess 2a somewhat larger than the size of each semiconductor pellet 21.

Consequently, it is possible to diminish wobbling of the semiconductor pellet 21 within each recess 2a and hence possible to improve the arrangement inclination accuracy in the horizontal direction of the semiconductor pellet 21.

Thus, it is possible to facilitate the recognition of pads (surface electrodes) of the semiconductor pellets 21 in wire bonding, with the result that it is possible to diminish the occurrence of defective wire bonding.

Moreover, since the mounting of chip parts 22 is performed first and thereafter the mounting of semiconductor pellets 21 is conducted, it is possible to diminish the factor of damage to the semiconductor pellets.

More particularly, the probability of the semiconductor pellets 21 becoming defective under the influence of an external stress is high in comparison with the chip parts 22, so it is preferable that the semiconductor pellets 21 be mounted after the mounting of the chip parts 22, whereby the possibility of damage of the semiconductor pellets 21 can be decreased.

Thereafter, the solder reflow step S5 shown in FIG. 3 is conducted.

In this step there is made reflow of solder for the matrix substrate 27 to connect the chip parts 22 and the semiconductor pellets 21 on the wiring substrate 2 by solder.

Subsequently, the automatic visual inspection of step S6 is performed.

In this step the matrix substrate 27 after the reflow is subjected to a visual inspection to check whether any reflow defect is present or not.

In this case, if laser light is used to detect the position of each mounted part, the position of the mounted part can be recognized accurately by recognizing a stepped portion on the wiring substrate 2.

For example, by recognizing through holes 2h shown in FIG. 11(b), which through holes are formed in each wiring substrate 2 of the matrix substrate 27 shown in FIG. 11(a), or by recognizing surface wires 2d shown in FIG. 7(b), it is possible to recognize the position of each mounted part accurately.

Thereafter, the wire bonding step S7 is carried out.

In this step, for example as shown in FIG. 4(e), wire bonding is performed using wires 24 such as gold wires, whereby the pads as surface electrodes on the semiconductor pellets 21 and the corresponding substrate-side terminals 2i (see FIG. 5(b)) on the wiring substrate 2 are connected together through the wires 24.

Subsequently, the visual inspection of step S8 is performed.

In this step, the matrix substrate 27 after the wire bonding is subjected to a visual inspection to check whether there is any wire bonding effect or not.

Thereafter, the resin (sealing resin 23) coating of step S9 is performed.

In this step, as shown in FIG. 4(f), the sealing resin 23 is added dropwise onto the recesses 2a in each wiring substrate 2 of the matrix substrate by a potting method to seal the semiconductor pellets 21 and the wires 24 with the sealing resin 23.

In this case, the sealing resin 23 is applied by potting to the recesses 2a of the wiring substrate 2 while avoiding dividing grooves 27b in the matrix substrate 27 shown in FIG. 12(a) to seal the semiconductor pellets 21 with the resin.

More specifically, the sealing resin 23 is applied for each individual block, i.e., for each wiring substrate 2 on the matrix substrate 27, as indicated by resin coating ranges 41 in FIG. 12(b), in such a manner that the sealing resin 23 is not applied to the dividing grooves 27b formed as individual substrate dividing slits in the matrix substrate 27.

Thus, since the sealing resin 23 is not applied to the dividing grooves 27b formed in the matrix substrate 27, it is possible to prevent the sealing resin 23 from flowing through the through holes 2h shown in FIG. 11(b) and lapping on the back side of the substrate, which would exert a bad influence on the substrate when the substrate division is performed.

Thereafter, the cap insertion of step S10 is conducted.

Figure 13:
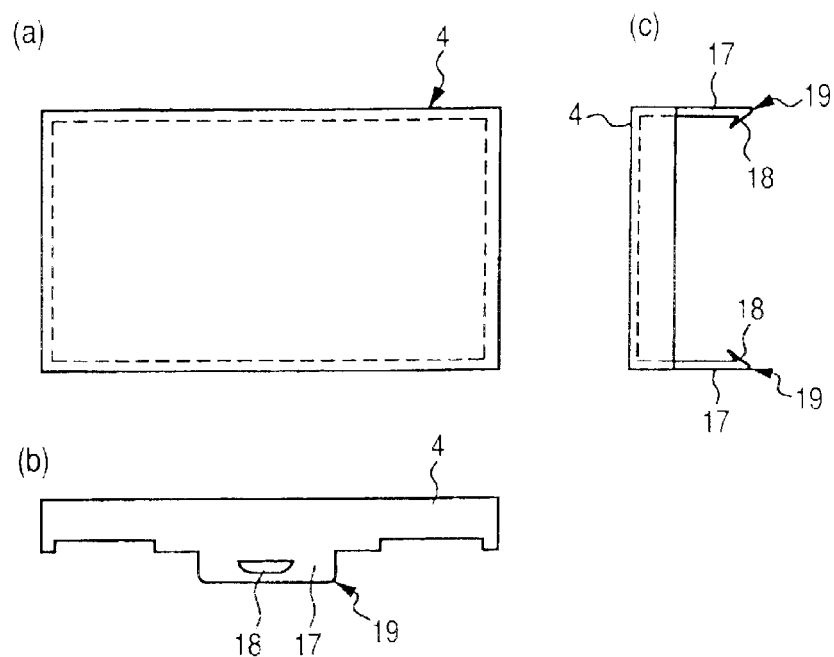
Figure 14:
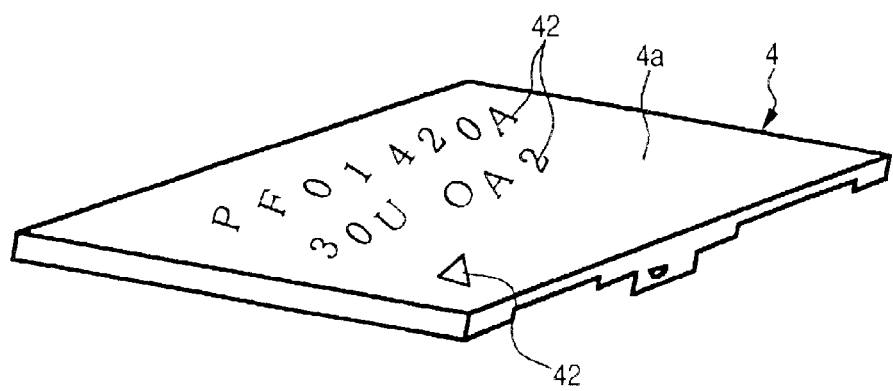
FIG. 14 shows an example in which marks are affixed to the cap illustrated in FIG. 13.
Figure 15:
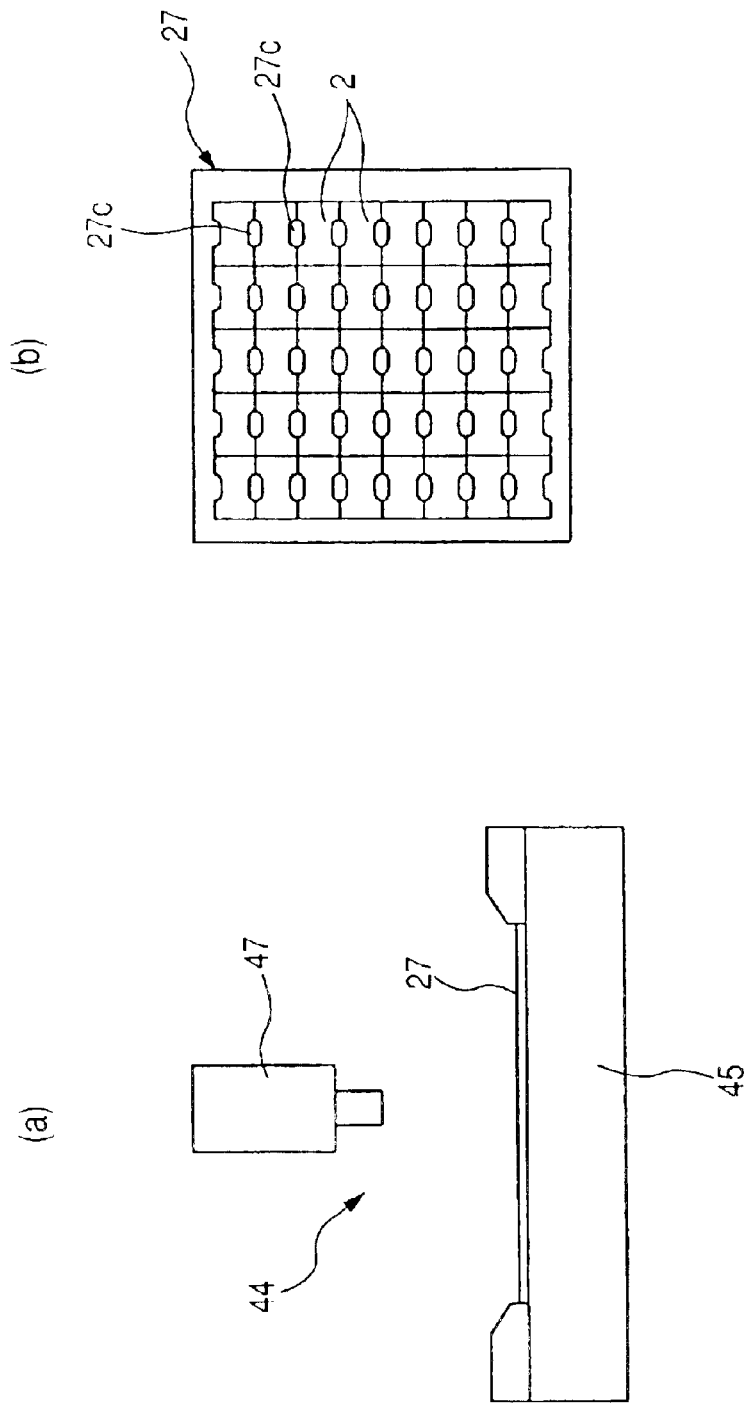

In the cap inserting step performed in this second embodiment, such marking as shown in FIG. 14, UV (ultraviolet) drying of marks 42 as recognition marks, mark visual inspection by pattern recognition of the marks 42, and cap insertion are carried out by a continuous through process for the cap 4 shown in FIG. 13. Further, only such caps 4 as are judged to be non-defective by the mark visual inspection in the cap inserting step are attached (inserted) to the wiring substrate. By so doing it is possible to not only shorten the assembling time in the cap inserting step but also prevent the incorporation of a cap 4 with another mark 42 affixed thereto.

First, marking is performed to put the marks 42 on each cap 4 in the cap inserting step.

For example, as shown in FIGS. 13(a), (b), and (c), the cap 4 is formed in a box shape using a metallic plate and is provided with opposed, hook support arms 17 (hook support portions) for supporting the hooks 19 shown in FIG. 1, the hooks 19 being engageable with each wiring substrate 2 on the matrix substrate 27.

As shown in FIG. 14, the marks 42 as recognition marks comprise characters and symbols, representing a production or model number of the high-frequency module 1.

The marks 42 are affixed to a surface 4a of the cap 4.

Subsequently, the marks 42 are UV-dried and are then subjected to a visual inspection by pattern recognition to select caps 4 with non-defective marks 42 affixed thereto.

Thereafter, the caps 4 thus judged to be non-defective are fitted (attached) one by one onto the wiring substrates 2 on the matrix substrate 27.

Since only non-defective caps 4 are attached to the wiring substrates 2 after the inspection of marks 42 on the marked caps, it is possible to prevent the mounting of defective caps such as unmarked caps, caps with defective marks, or caps with other marks.

Thus, since there is no fear that caps which are defective with respect to the marks 42 may be attached to the wiring substrates, it is possible to rationalize the manufacturing line.

Next, the following description is provided about how to insert (mount) each cap 4.

A description will first be given about the construction of a cap mounting apparatus 44 shown in FIGS. 15(a) and 16, which is used in the cap inserting step.

The cap mounting apparatus 44 is made up of an XY table 45 which supports the matrix substrate 27, a cap mounting unit 46, plural hook holes 27c (see FIG. 15(b)) which are formed as recognizing portions in the matrix substrate 27 mounted on the XY table 45, a recognizing camera 47 for picking up images of the hook holes 27c, and an alignment station 48 for disposing each cap 4 in an inclined state.

The mounting unit 46 is provided with an absorption collet 46a which can absorb and hold the cap 4, a first cylinder 46b and a first spring 46c for moving the absorption collet 46a vertically, a first slider 46d for guiding the vertical movement of the absorption collet 46a, a pusher 46i for pushing the cap 4 when the cap is to be fitted on the wiring substrate, a second cylinder 46e and a second spring 46f for moving the pusher 46i vertically, and a second slider 46g for guiding the vertical movement of the pusher 46i.

In the alignment station 48 there are provided a main tilting jig 48a for tilting and supporting the cap 4 at a predetermined angle and an auxiliary tilting jig 48b for guiding the cap 4 from the outside when the cap is tilted and supported by the main tilting jig 48a.

A absorption surface 46j of the absorption collet 46a is formed at an angle equal to the angle of a support surface of the main tilting jig 48a so that the cap 4 can be tilted and held by the absorption collet 46a at the same angle as the inclination angle of the cap tilted by the main tilting jig 48a when the cap is absorbed and held from the main tilting jig by the absorption collet 46a.

When mounting the cap 4, first the matrix substrate 27 is disposed on the XY table 45, as shown in FIG. 15(a), and thereafter images of the hook holes 27c in the matrix substrate 27 shown in FIG. 15(b) are picked up by the recognizing camera 47 and their positions are detected.

Figure 16:
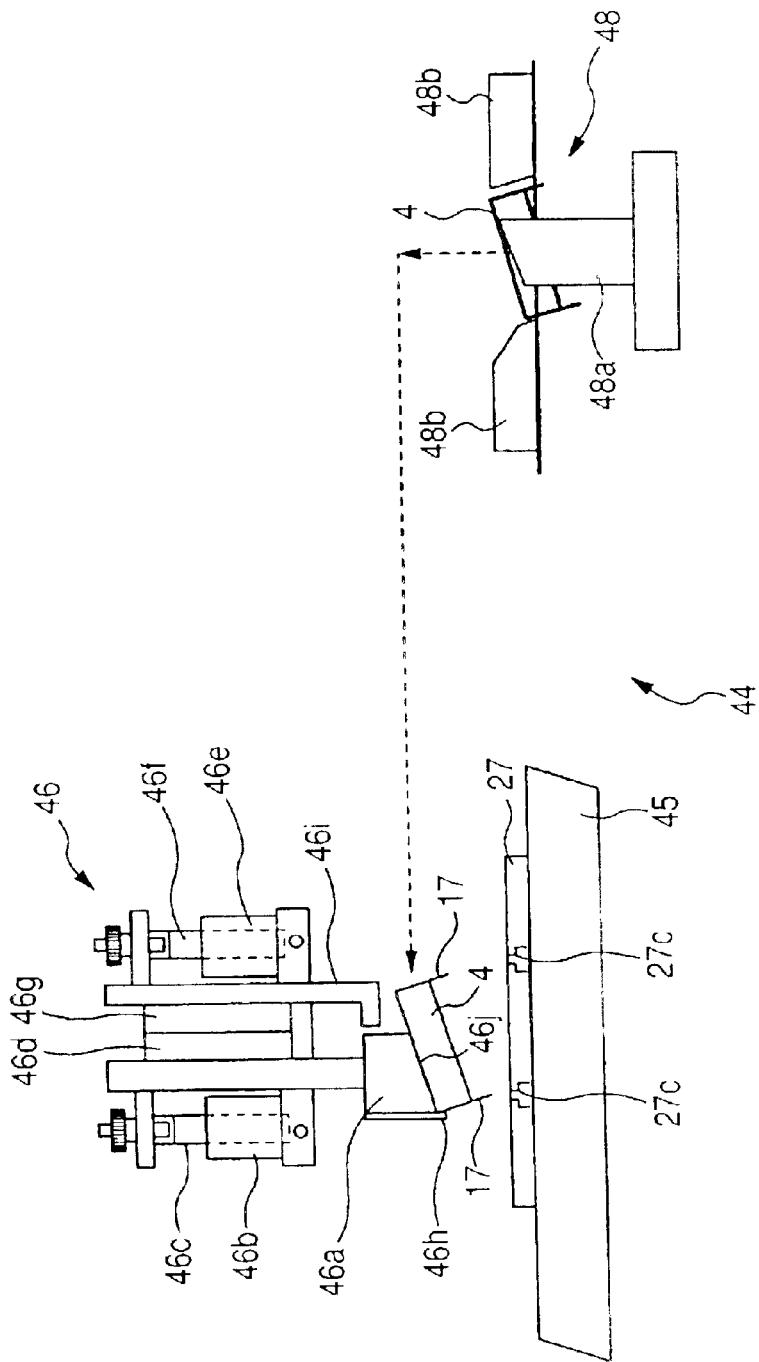
FIG. 16 shows, as an example, on what principle the transfer of a cap is performed in the cap inserting step which is carried out in the semiconductor device manufacturing method according to the present invention.

On the other hand, as shown in FIG. 16, each cap 4 judged to be non-defective is tilted and supported at a predetermined angle by the main tilting jig 48a in the alignment station 48 of the cap mounting apparatus 44 and thereafter the cap 4 is absorbed and held by the absorption collet 46a in the mounting unit 46 while allowing the cap 4 to be kept tilted.

In this state, the cap 4 is moved together with the mounting unit 46 so that one hook support arm 17 located on a lower side by tilting out of the two opposed hook support arms 17 of the cap 4 is disposed above a desired hook hole 27c in the matrix substrate 27 mounted on the XY table 45.

In this case, with respect to each of plural wiring substrates 2 on the matrix substrate 27, the hook support arm 17 located on a lower side by tilting out of the two opposed hook support arms 17 of the cap 4 is inserted into the hook hole 27c located on an adjacent cap-free side out of the two hook holes 27c for insertion therein of the hook support arms.

As shown in FIGS. 17(a) and (b), by first inserting the corresponding hook support arm 17 (the A-side hook support arm 17 in the figures) into the hook hole 27c located on an adjacent cap 4-free side, out of the two opposed hook support arms 17 of the cap 4, it is possible to avoid interference with an already-mounted cap 4.

Consequently, it is possible to prevent the occurrence of a trouble caused by the interference.

As shown in FIG. 17(a), the absorption collet 46a is brought down by the first cylinder 46b located on A-side of the mounting unit 46 in the cap mounting apparatus 44, and with tilting of the cap 4, the hook 19 of the hook support arm 17 is inserted obliquely into the corresponding hook hole 27c.

In this case, by obliquely inserting the hook support arm 17 of the cap 4 on the A-side of the cap mounting apparatus 44, the insertion can be done while keeping the hook 19 of the hook support arm 17 out of contact with the hook hole 27c.

That is, the hook pawl 18 of the hook 19 and the hook hole 27c do not contact each other upon insertion of the hook support arm 17 into the hook hole, so that it is possible to prevent the matrix substrate 27 from being damaged in the vicinity of the hook holes 27c and hence possible to improve both yield and quality of the matrix substrate 27.

Thereafter, as shown in FIG. 18(a), the wiring substrate 2 is shifted transversely as indicated at 46k (the XY table 45 is moved by a preset value from B- to A-side, thereby causing the wiring substrate 2 on the matrix substrate 27 to move) for one (A-side) hook support arm 17 which has been inserted into the hook hole 27c located on the adjacent cap 4-free side, thereby imposing a load on the A-side hook support arm 17.

At this time, the A-side end portion of the surface 4a of the cap 4 shown in FIG. 18(a) comes into abutment against an arm stopper 46h shown in FIG. 18(b) of the absorption collet 46a and is supported thereby, so that the load induced by the transverse shift 46k of the wiring substrate 2 is applied to the A-side hook support arm 17. As a result, the A-side (one) hook support arm 17 is deflected within its elastic region in a direction away from the B-side (the other) hook support arm 17 (see FIG. 18(c)).

If the foregoing preset value for the transverse shift 46k of the XY table is set within a range within which the resilience of the hook support arm 17 is not lost, it becomes possible to let the hook support arm deflect within its elastic region.

With the A-side hook support arm 17 thus deflected, the distance between the two hook support arms 17 of each cap 4 becomes wider, resulting in that the hook pawl (see FIG. 1) of the hook 19 of the A-side hook support arm 17 comes into engagement with the associated engaging portion of the wiring substrate 2. At the same time, as shown in FIG. 18(b), the hook 19 of the B-side (the other) hook support arm 17 is disposed above the other hook hole 27c n the matrix substrate 27.

In this state, as shown in FIG. 19(a), the pusher 46i is brought down by both B-side second cylinder 46e and second spring 46f to push the B-side end portion of the surface 4a of the cap 4, whereby the B-side (the other) hook support arm 17 is inserted into the other hook hole 27c opposed to the hook hole 27c shown in FIG. 17(a) into which the A-side hook support arm 17 has been inserted.

Figure 18:
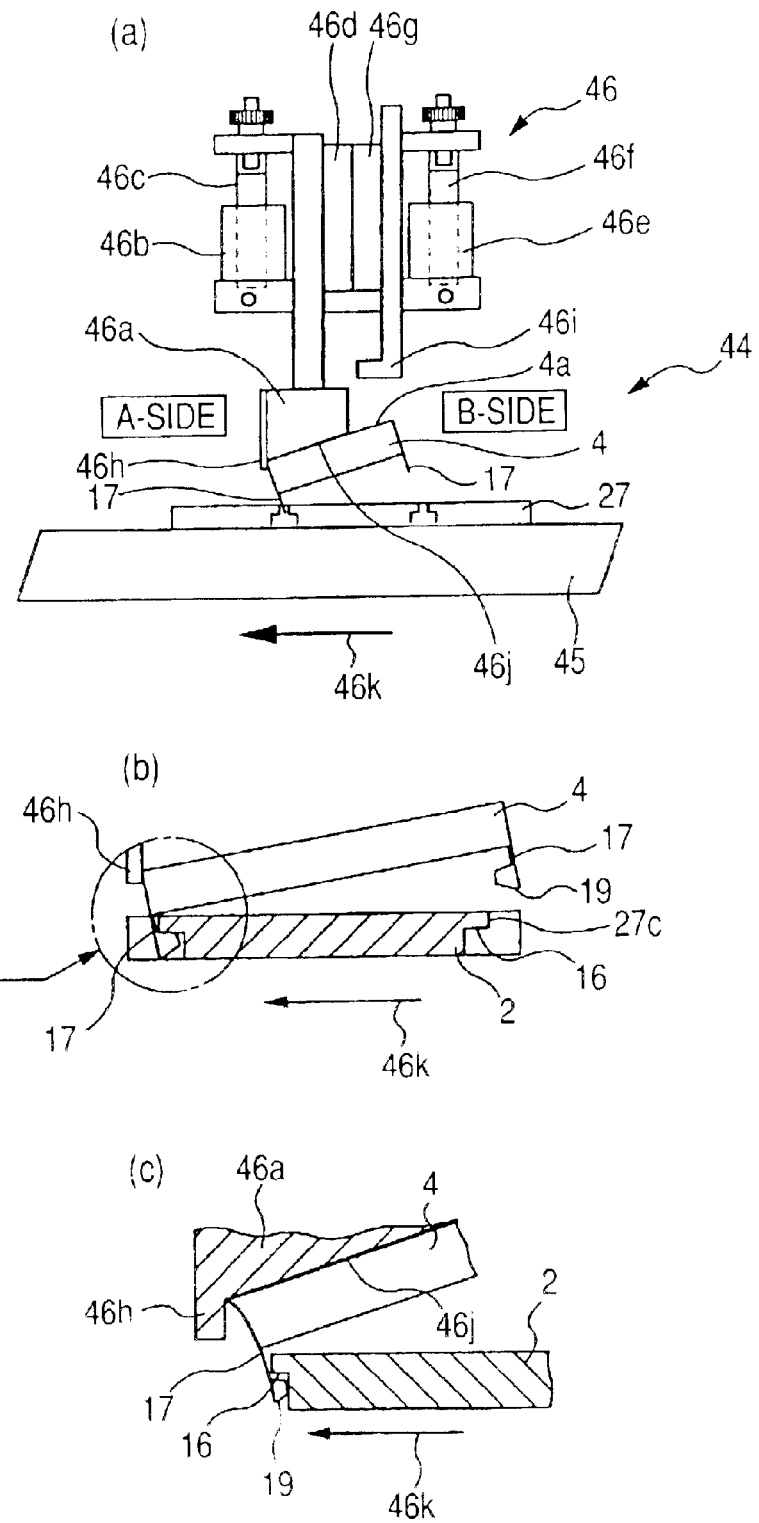

In this case, the other hook hole 27c is located close to the A-side hook support arm 17 by the transverse shift 46k shown in FIG. 18 of the matrix substrate 27, so that at the time of insertion of the B-side hook support arm 17, as is the case with the A-side, the hook pawl 18 of the hook 19 and the hook hole 27c do not contact each other, thus making it possible to prevent the occurrence of damage in the vicinity of the other hook hole 27c in the matrix substrate 27.

As a result, it is possible to improve the yield and quality of the matrix substrate 27.

Thereafter, the loading on the A-side hook support arm 17 by the transverse shift 46k of the wiring substrate 2 on the matrix substrate 27 is released, whereby the hooks 19 of both A- and B-side hook support arms 17 are respectively engaged with the engaging portions 16 formed on both sides of the wiring substrate 2.

In this way the fitting (mounting) of caps 4 onto the wiring substrates on the matrix substrate 27 can be completed, as shown in FIG. 19(b), and thus an automatic mounting of caps 4 to the matrix substrate 27 can be done easily.

Thus, as shown in FIG. 4(g), each wiring substrate 2 with chip parts 22 and semiconductor pellets 21 mounted thereon can be covered with cap 4.

According to the cap mounting method adopted in this second embodiment, it is possible to eliminate such inconveniences as dislodgment and wobbling of each cap 4.

Moreover, the efficiency of mass production can be improved because it is possible to effect sealing with caps 4 on a continuous assembly line using the matrix substrate 27.

Further, in comparison with the sealing method by cap soldering, it is possible to greatly decrease the number of working steps. It is also possible to omit a washing step for the removal of flux stain or the like.

Figure 20:
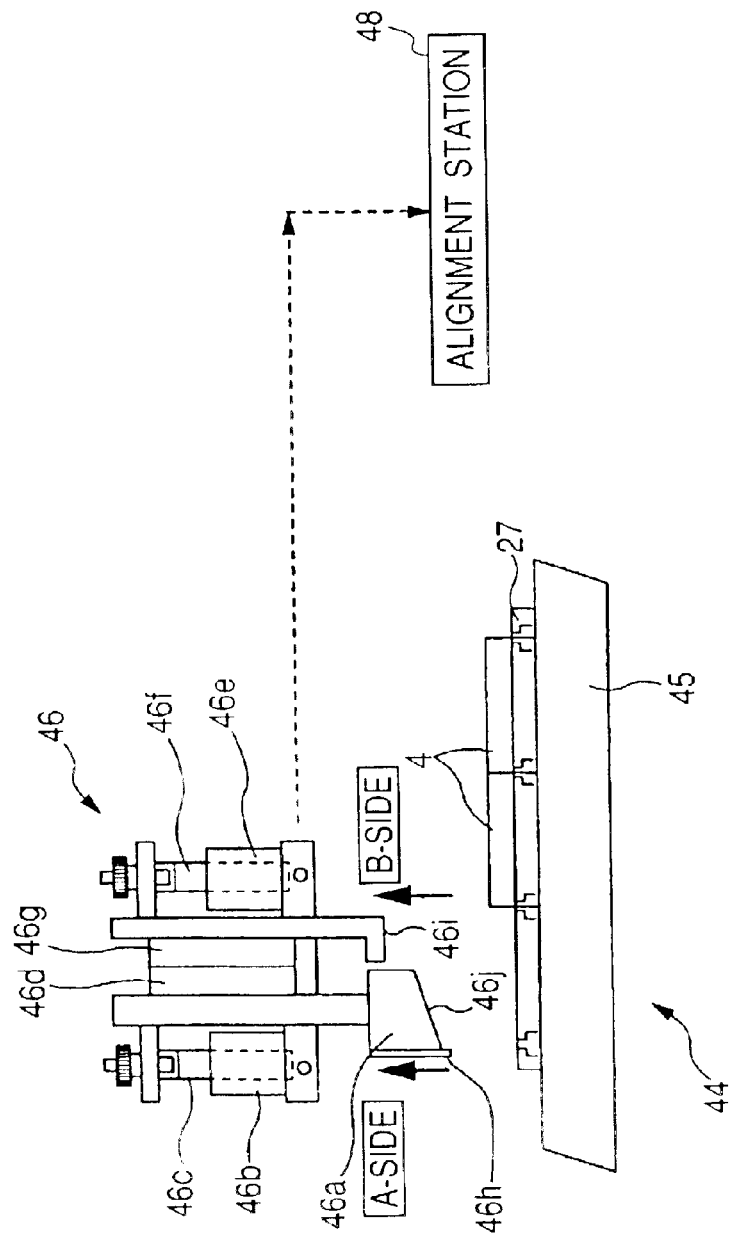
FIG. 20 shows, as an example, a principle of operation of a cap mounting apparatus which is performed after the insertion of a cap in the cap inserting step adopted in the semiconductor device manufacturing method according to the present invention.

Thereafter, as shown in FIG. 20, the absorption collet 46a and the pusher 46i are raised and returned to their original positions with the first and second sliders 46d, 46g as guides and the mounting unit 46 is moved onto the alignment station 48 to complete the cap inserting step.

Subsequently, the substrate dividing step S11 shown in FIG. 3 is carried out to divide the matrix substrate 27 into individual wiring substrates 2, which are in the form of such individual high-frequency modules 1 as shown in FIG. 4(h).

Then, the characteristic selecting step S12 is carried out to acquire electric characteristics of each high-frequency module 1 and a high-frequency module 1 is selected in accordance with the results obtained.

In the high-frequency module 1, the characteristics of the module vary according to variations in the resistance of wiring pattern conductors on the ceramic substrate, i.e., the wiring substrate 2. In the characteristic selecting step, therefore, electric characteristics of the wiring substrate 2 in the high-frequency module are monitored.

In assembling the high-frequency module 1, therefore, characteristics of the semiconductor pellets 21 are classified grade by grade beforehand and constants suitable for the combination of wiring substrate 2 and semiconductor pellets 21 used are selected before the assembly.

Thus, there are provided characteristics-selected wiring substrate 2 and semiconductor pellets 21 and then the semiconductor pellets 21 and chip parts 22 are mounted on the thus-selected wiring substrate 2, whereby it is possible to let the characteristics of the high-frequency module 1 fall under an allowable range. As a result, it is possible to assemble a high-frequency module 1 which is high in quality and stable.

Figures 21, 22:
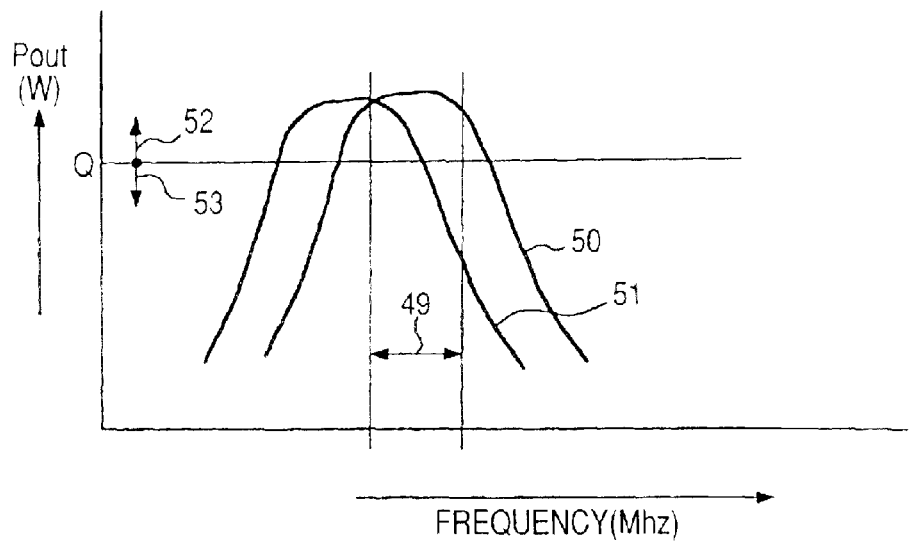
FIG. 21 is an output characteristic diagram showing an example of characteristic inspection results in a characteristic selecting step adopted in the semiconductor device manufacturing method according to the present invention.
FIG. 22 is a pellet grade classifying diagram showing an example of inspection results obtained in the inspection of pellet characteristics which is performed in the semiconductor device manufacturing method according to the present invention.

FIG. 21 shows an example of a frequency-output (Pout) relation in the characteristics of the wiring substrate 2 as the high-frequency module 1.

For example, in FIG. 21, if an output Q (W) is assumed to be an output acceptance-rejection threshold, then in the case of a first sample 50 of the high-frequency module 1, there is obtained a satisfactory output acceptance 52 in a working frequency band 49, affording a non-defective high-frequency module 1.

In the case of a second sample 51, however, the output acceptance 52 is obtained in only a half region (the low frequency-side region) in the working frequency band 49 and an output rejection 53 results in the remaining about half region (the high frequency-side region) in the working frequency band. Thus, the high-frequency module 1 of the second sample proves to be defective.

FIG. 22 shows an example of grade classification of semiconductor pellets 21. This grade classification has been conducted for each semiconductor pellet by means of an automatic die sorter on the basis of data obtained in the preceding wafer inspection step.

In FIG. 22, Ciss, Idss, and Vth stand for capacity, leakage current, and threshold voltage, respectively. For example, by combining three semiconductor pellets 21 of Grade NO. 3, 4, 8 in FIG. 22 it is possible to set an optimum circuit constant.

Thereafter, the taping step S13 shown in FIG. 3 is performed.

In this step, a plurality of selected high-frequency modules 1 are subjected to taping and taken up for storage onto a reel 43 shown in FIG. 4(i).

According to the semiconductor device (high-frequency module 1) manufacturing method of this second embodiment, the number of assembling steps can be decreased from the conventional twelve steps to nine steps, whereby it is possible to attain the rationalization of the manufacturing line.

Besides, since high-frequency modules 1 are assembled using the matrix substrate 27, it is possible to improve the throughput and reduce the cost of substrate material. As a result, the productivity can be increased to about three times as high as that in the conventional assembling method and there can be attained about 50% cut in cost.

Next, a third embodiment of the present invention will be described below with reference to FIGS. 1 to 3 and 23 to 34.

In this third embodiment, reference will be made mainly to a substrate dividing method adopted in the substrate dividing step S11 out of the assembling steps for the high-frequency module 1 shown in FIG. 3, as well as a substrate dividing apparatus used therein as a semiconductor device manufacturing apparatus.

First, with reference to FIG. 23, a description will be given about the construction of the substrate dividing apparatus used in the substrate dividing step.

In the substrate dividing apparatus, indicated at 54, wiring patterns 27f formed on a back side 271 of a matrix substrate 27 with caps 4 attached thereto, the wiring patterns 27f which span dividing grooves (one-column dividing lines 27m and individual dividing lines 27d in FIG. 28(a)) formed on a surface (a first main surface) of the matrix substrate 27, are torn off along the one-column dividing liens 27m and individual dividing lines 27d simultaneously with the substrate dividing work.

More specifically, the matrix substrate 27 with caps 4 attached thereto are divided successively along the vertical and horizontal dividing grooves to obtain individual products (high-frequency modules 1). The wiring patterns 27f formed on the back side 271 of the matrix substrate 27 are also torn off simultaneously with the division of the matrix substrate.

Figure 32:
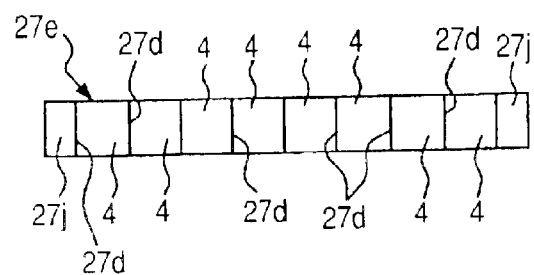
FIG. 32 is a plan view showing a structural example of an individual dividing substrate as a multi-substrate after performing the one-column substrate division shown in FIG. 29.
Figure 33:
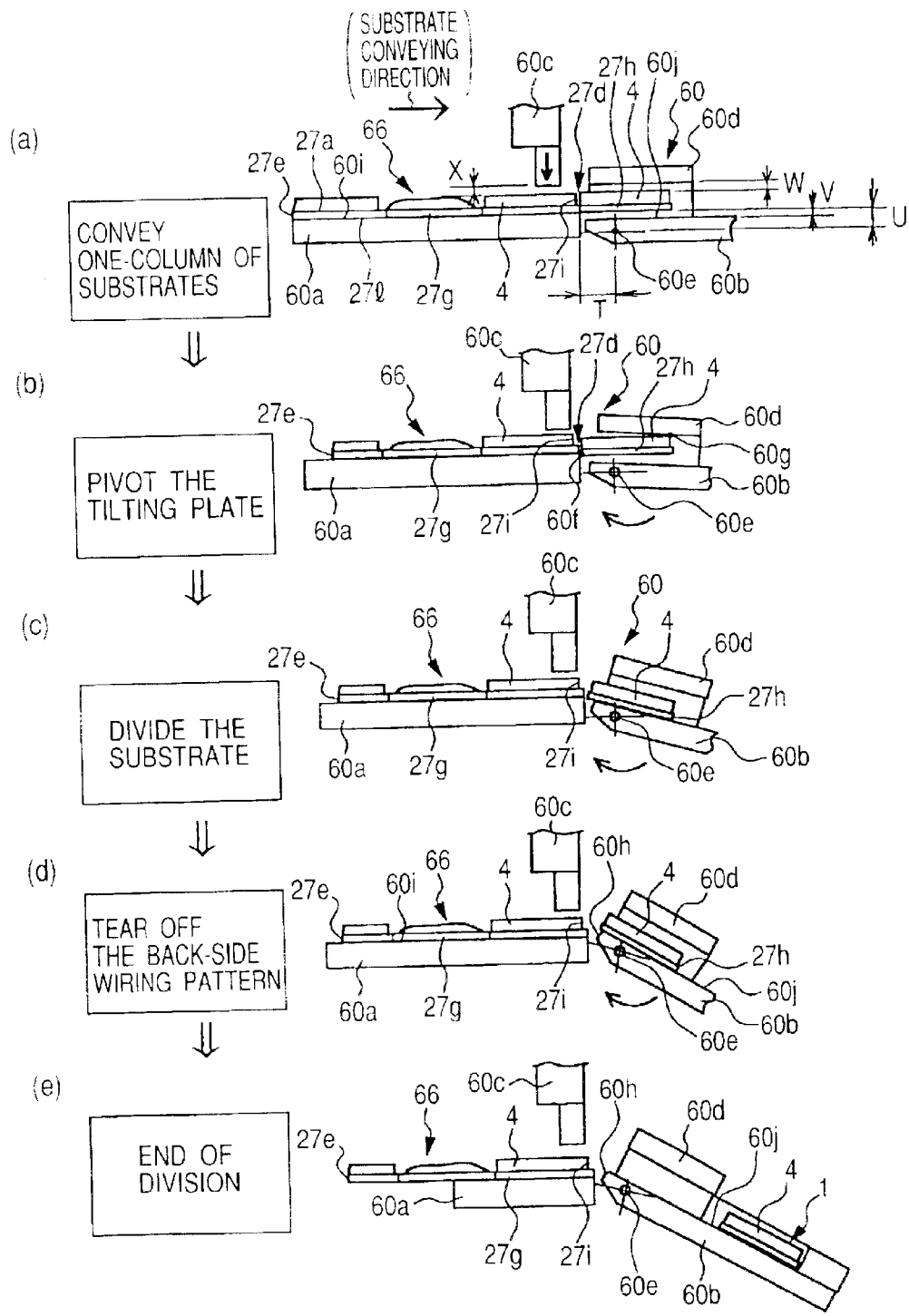
FIGS. 33(a), 33(b), 33(c), 33(d), and 33(e) comprise a process flow chart and division principle diagrams corresponding to processes, showing an example of an individual substrate dividing method adopted in the substrate dividing step which is carried out in the semiconductor device manufacturing method according to the present invention.

More specifically, first a single matrix substrate 27 shown in FIG. 28(*a*) is divided along the vertically extending one-column dividing grooves or lines 27*m* to obtain plural sets of individual-dividing substrates 27*e* in the form of paper strips as shown in FIG. 32. Then, each strip of substrates are divided along the individual dividing lines 27*d* as dividing grooves to afford individual high-frequency modules 1.

Further, every time the substrate division is thus performed, the wiring patterns 27*f* formed on the back side 271 of the matrix substrate are torn off and divided thereby.

A description will now be given about the construction of the substrate dividing apparatus (semiconductor device manufacturing apparatus) 54 shown in FIG. 23. The substrate dividing apparatus 54 comprises a loader 55 on which is set a rack containing matrix substrates 27, a substrate supply section (supply section) 56 for supplying the matrix substrates 27 one by one to a one-column substrates dividing section 58, a substrate conveying section 57 for conveying substrates one column at a time by means of substrate conveying pawls, the one-column substrates dividing section (dividing section) 58 for dividing each matrix substrate 27 into individual dividing substrates 27*e* along one-column dividing lines 27*m*, an individual dividing substrates conveying section 59 for conveying the individual dividing substrates 27*e* formed by the one-column division, and an individual substrate dividing section (dividing section) 60 for dividing the individual dividing substrates 27*e* into individual products (high-frequency modules 1).

In the substrate dividing apparatus 54 are installed an individual conveying section 61 for conveying one by one the products obtained by the individual division, a positioning section 62 for positioning the products in four directions with pawls, a size checking section 63 for inserting each product into a size checking pocket to measure external dimensions of the product, a product storage section (storage section) 64 for the storage of products onto a tray which products are judged to be non-defective in the size checking section, and a defective product discharge conveyor 65 for discharging products which are judged to be defective, for example due to substrate burrs, in the size checking section.

In the size checking section 63 not only the product size but also the product thickness and whether a product is chipped or not may be checked.

Next, how to fabricate the high-frequency module 1 shown in FIGS. 1 and 2 will be described below mainly about the substrate dividing step S9 with reference to the manufacturing process flow chart of FIG. 24.

Figure 26:
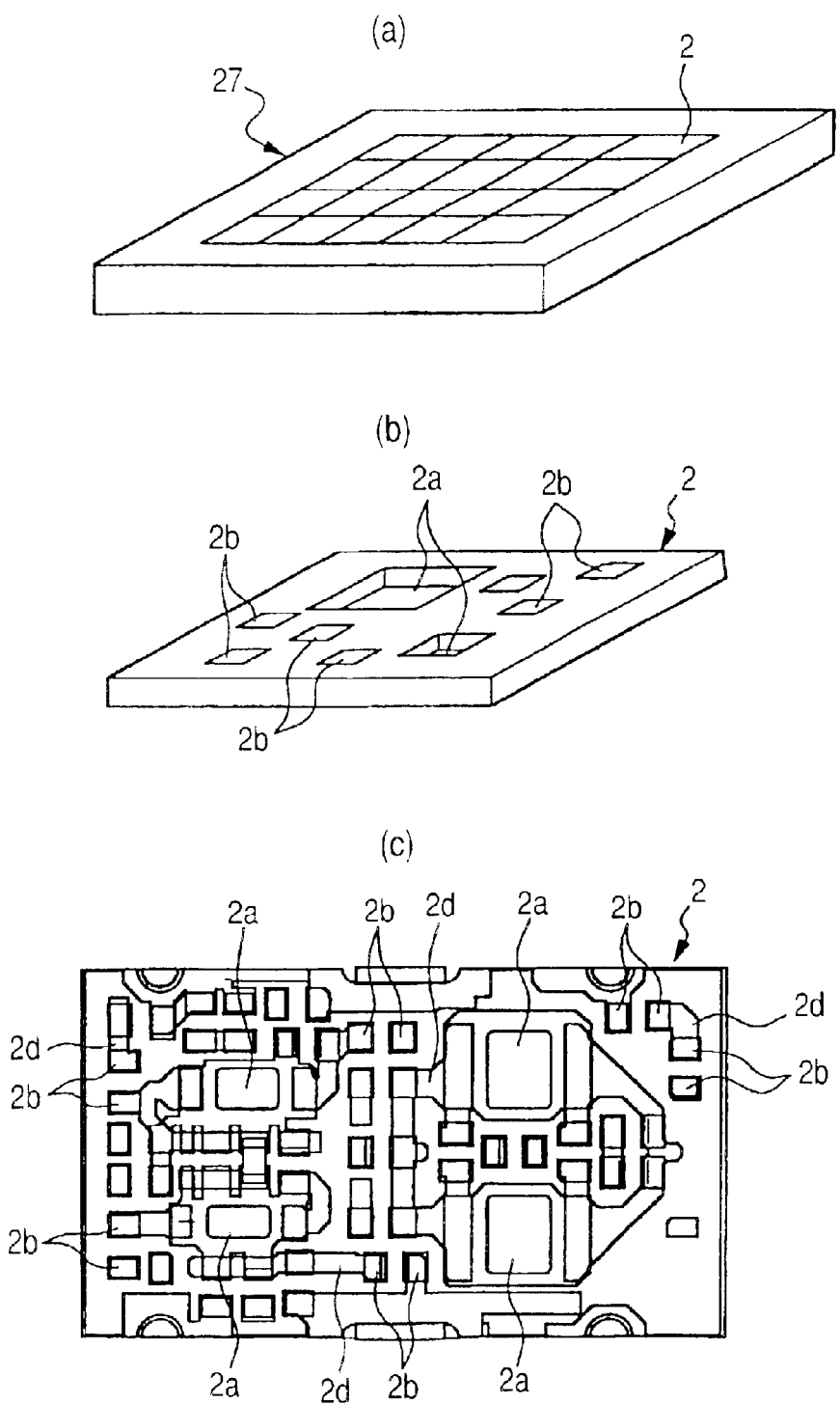

In connection with this third embodiment, reference will be made below to a case where plural high-frequency modules 1 are assembled together from such a single matrix substrate 27 with plural wiring substrates 2 formed thereon as shown in FIG. 26.

Figure 25:
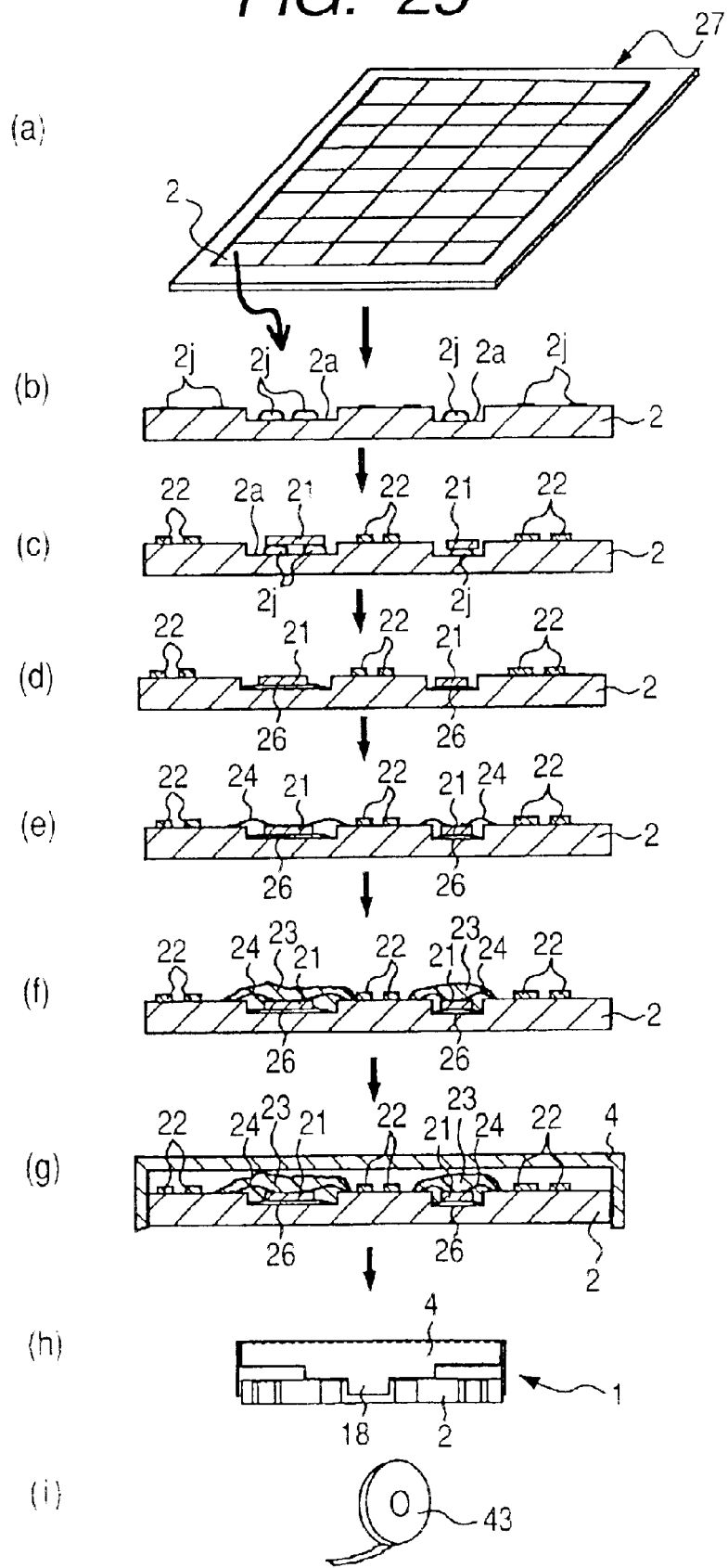
FIGS. 25(a), 25(b), 25(c), 25(d), 25(e), 25(f), 25(g), 25(h), and 25(i) are sectional, side, and perspective views showing a structural example of a wiring substrate and a high-frequency module corresponding to each of main steps illustrated in FIG. 24.

First, there is provided a matrix substrate 27 with plural wiring substrates 2 formed thereon such as that shown in FIGS. 25(*a*) and 26(*a*). For example, the matrix substrate 27 is a ceramic substrate and the size thereof is 78.75 mm×75.00 mm in case of forty wiring substrates 2 being formed on the matrix substrate. The matrix substrate 27 may be a glass fabric-based epoxy resin substrate other than the ceramic substrate.

The wiring substrates 2 are multi-layer printed circuit substrates, for example, and on the surface of each wiring substrate 2 are formed one or plural recesses 2*a* and electrodes 2*b* for chip parts according to the number of bare chip mounting semiconductor pellets 21 and chip parts 22, as shown in FIG. 26(*b*). The electrodes 2*b* for chip parts are connected through various surface wires 2*d*, as shown in FIG. 26(*c*).

As shown in the same figure, semiconductor pellets 21 are mounted respectively in the recesses 2*a*, while chip parts 22 are mounted on the electrodes 2*b* for chip parts formed on the surface of the wiring substrate 2 and shown in FIG. 26(*c*).

Figure 24:
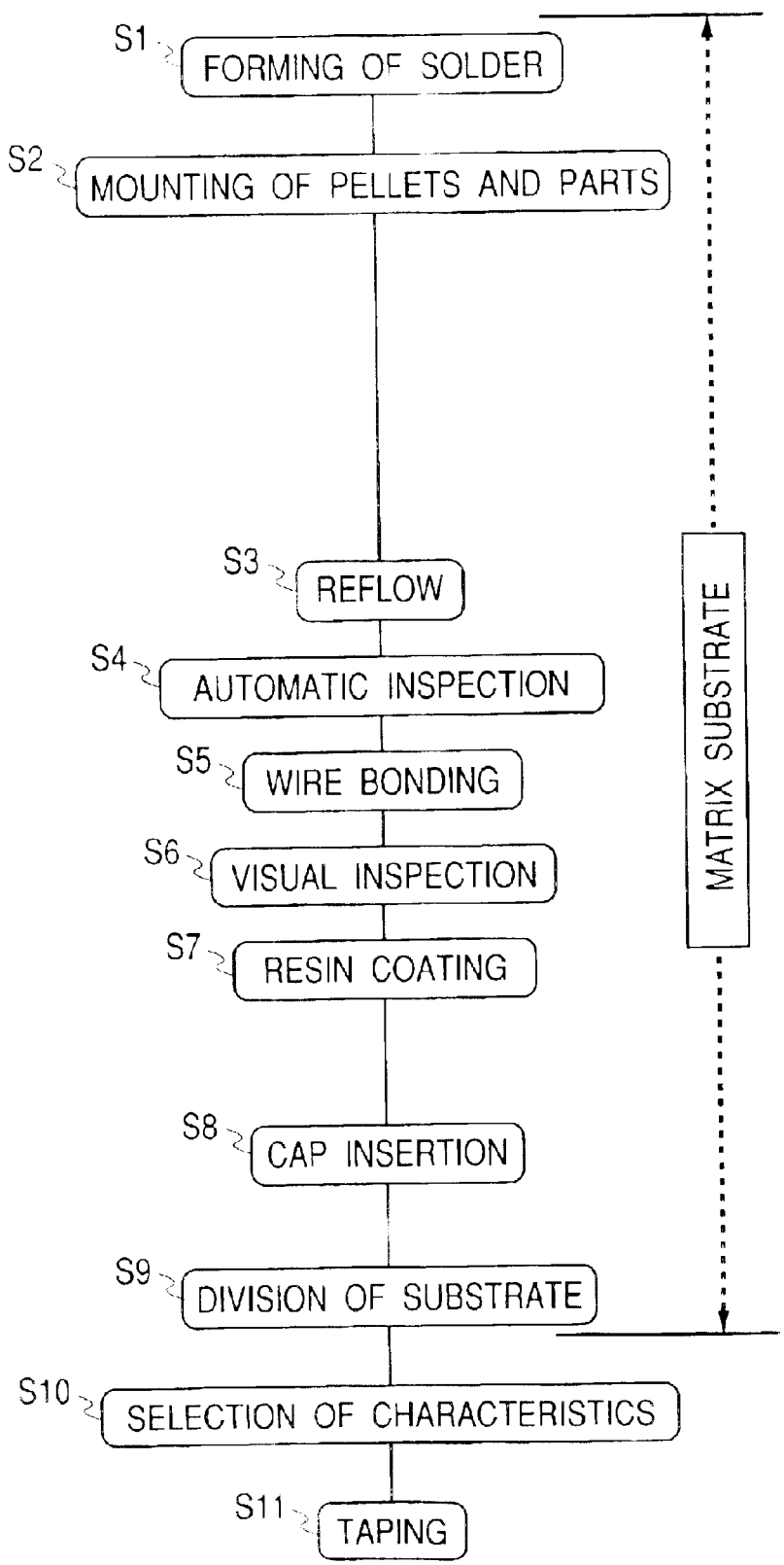
FIG. 24 is a flow chart of a manufacturing process, showing an example of an assembling procedure which is adopted in the high-frequency module manufacturing method shown in FIG. 1.

Thereafter, a solder forming step S1 in FIG. 24 is carried out for the wiring substrate 2.

More specifically, as shown in FIG. 25(*b*), reflow solders 2*j* as connecting solders are formed respectively in the recesses 2*a* and chip parts electrodes 2*b* on the wiring substrate 2 by solder printing or by potting.

Further, a pellets/parts mounting step S2 is performed to dispose the semiconductor pellets 21 in the recesses 2*a* formed in each wiring substrate 2 on the matrix substrate 27 and also dispose the chip parts 22 on the chip parts electrodes 2*b* formed on the wiring substrate surface.

Thereafter, a reflow step S3 is carried out.

To be more specific, the matrix substrate 27 is heated to melt the reflow solders 2*j* formed on each wiring substrate 2, so that the semiconductor pellets 21 and chip parts 22 are soldered by reflow, as shown in FIG. 25(*d*).

Thereafter, an automatic visual inspection step S4 is carried out.

In this step, the matrix substrate 27 after reflow is subjected to a visual inspection to check whether there is any defective reflow or not.

Subsequently, a wire bonding step S5 is carried out.

In this state, for example as shown in FIG. 25(*c*), wire bonding is performed using wires 24 such as gold wires to connect pads as surface electrodes on the semiconductor pellets 21 with substrate-side terminals on each wiring substrate 2 of the matrix substrate 27, using wires 24.

Thereafter, a visual inspection step S6 is carried out.

In this step, the matrix substrate 27 after wire bonding is subjected to a visual inspection to check whether there is any defective wire bonding or not.

Then, a resin (sealing resin 23) coating step S7 is performed.

In this step, as shown in FIG. 25(*f*), the sealing resin 23 is added dropwise into the recesses 2*a* formed in the wiring substrate 2 on the matrix substrate 27 and shown in FIG. 25(*b*) to seal the semiconductor pellets 21 and wires 24 with the sealing resin 23.

Thereafter, a cap inserting step S8 is carried out to attach a cap 4 to each wiring substrate 2, as shown in FIG. 25(*g*). As a result, each wiring substrate 2 on the matrix substrate 27 is covered with the cap 4.

Subsequently, a substrate dividing step S9 is carried out to divide the matrix substrate 27 into individual wiring substrates 2, whereby there is obtained such an individual high-frequency module 1 as shown in FIG. 25(*h*).

Now, a substrate dividing method adopted in the substrate dividing process will be described below in accordance with a substrate dividing process flow chart shown in FIG. 27.

First, in the substrate dividing apparatus 54 shown in FIGS. 23(*a*) and 23(*b*), a loading step S21 is performed to set a rack onto a loader 55, the rack containing matrix substrates 27 with plural caps 4 attached thereto correspondingly to wiring substrates 2.

As shown in FIG. 28(*a*), one-column dividing lines 27*m* as vertical dividing grooves and individual dividing lines 27d as horizontal dividing grooves are formed on a surface 27a of each matrix substrate 27. Further, as shown in FIG. 28(b), on a back side 27l of each matrix substrate 27 are formed wiring patterns 27f which span either (or both) of one-column dividing lines 27m and individual dividing lines 27d.

In other words, wiring patterns 27f are formed on a side (bending side) of each matrix substrate 27 on which a surface angle becomes smaller than 180° when the matrix substrate 27 is bent for substrate division, the wiring patterns 27f spanning either one-column dividing lines 27m or individual dividing lines 27d.

Subsequently, a substrate supply step S23 is performed to supply the matrix substrates 27 stored in the rack one by one to the one-column substrates dividing section 58.

Further, a substrate conveying step S23 is performed to convey the matrix substrates 27 pitch by pitch, or column by column, allowing each matrix substrate 27 to be disposed on a conveying chute (dividing support base) 58a of the one-column substrate dividing section 58, as shown in FIG. 29(a), and thereafter a one-column substrate edge division is conducted, followed by execution of a one-column substrates dividing step S24.

First, a remaining portion 27g (a remaining side after substrate division) of the matrix substrate 27 is disposed on the conveying chute 58a and is thereby supported on its back side 27l. At the same time, a dividing portion 27h (a side to be divided and cut off) contiguous to the remaining portion 27g is projected to the outside with respect to the conveying chute 58a and is disposed on a dividing chute (movable portion) 58b.

The dividing chute 58b is pivotable downward, i.e., in a direction opposite to the side where the matrix substrate 27 is disposed. The dividing chute 58b is disposed so that a pivot center 58e thereof is offset from in both a direction perpendicular to the back side 27l on the back side of the matrix substrate from a dividing position 27i where a one-column dividing line 27m is formed and a direction of the dividing portion 27h located outside from the dividing position 27i.

That is, the pivot center 58e of the dividing chute 58b is set at a position offset to the lower and right-hand sides from the dividing position 27i in FIG. 29(a).

Therefore, when the dividing chute 58b pivots downward about the pivot center 58e, as shown in FIG. 29(c), a dividing-side end portion 58h of the dividing chute 58b projects upward relative to a support surface 58i of the conveying chute 58a. Just thereafter, as shown in FIG. 29(d), the dividing chute 58b moves away from the conveying chute 58a.

As shown in FIG. 29(a), a difference in height of S=0.3 mm or so is formed between the support surface 58j of the dividing chute 58b and the support surface 58i of the conveying chute 58a so that the support surface 58j of the dividing chute 58b is lower than the support surface 58i of the conveying chute 58a.

By thus forming a gap of approximately the above difference in height S between the support surface 58j of the dividing chute 58b and the back side 27l of the dividing portion 27h of the matrix substrate 27, not only an initial pivoting motion becomes smooth when the dividing chute 58b pivots downward, but also it is possible to strongly thrust up the associated one-column dividing line 27m.

A dividing roof 58d (dividing tool), which serves as a loading portion for applying a load to the dividing portion 27h of the matrix substrate 27 at the time of substrate division, covers the surface 27a of the dividing portion 27h of the matrix substrate 27. The dividing roof 58d is provided so as to be pivotable interlockedly with the dividing chute 58b during pivoting of the chute.

Figure 31:
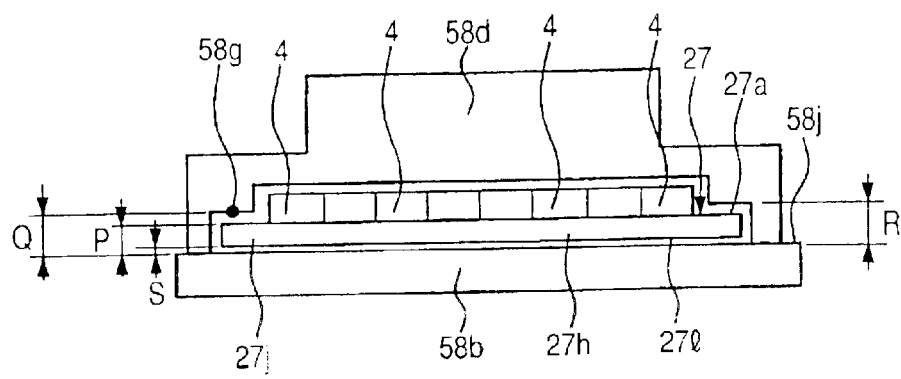
FIG. 31 is a side view showing a relation of arrangement between a loading portion and a dividing portion of the matrix substrate in the state shown in FIG. 29(b)

Further, as shown in FIG. 31, the dividing roof 58d has a shape such that when it is disposed in contact with an upper surface of the dividing chute 58b, there is formed such a gap as will be described below between it and the dividing portion 27h of the matrix substrate 27.

Given that the difference in height S between the support surface 58i of the dividing chute 58b and the support surface 58j of the conveying chute 58a is 0.3 mm, the distance between one end (the left-hand side in FIG. 31) of the surface 27a of the dividing portion 27h the matrix substrate 27 and the dividing roof 58d is Q–P, e.g., 1.20 mm–1.05 mm=0.15 mm. Further, the distance between an opposite end (the right-hand side in FIG. 31) of the surface 27a and the dividing roof 58d is R–P, e.g., 1.40 mm–1.05 mm=0.35 mm. Thus, there is a difference of about 0.2 mm between both gaps sizes.

With this difference, when a load is applied to the dividing portion 27h of the matrix substrate 27 by the dividing roof 58d, the load can be imposed on only one end (the left-hand end in FIG. 31) of the one-column dividing line 27 in the matrix substrate 27, whereby the substrate division can be started from one end portion (the left-hand side in FIG. 31) of the one-column dividing line 27m.

To be more specific, one end of the one-column dividing line 27m is cracked and thereafter this crack is allowed to be propagated to the opposite end of the dividing line 27m to effect substrate division along the line 27m.

On which side of the one-column dividing line 27m the smaller gap is to be formed is not specially limited. The smaller gap may be formed on the left side or the right side of the dividing line 27m.

Figure 27:
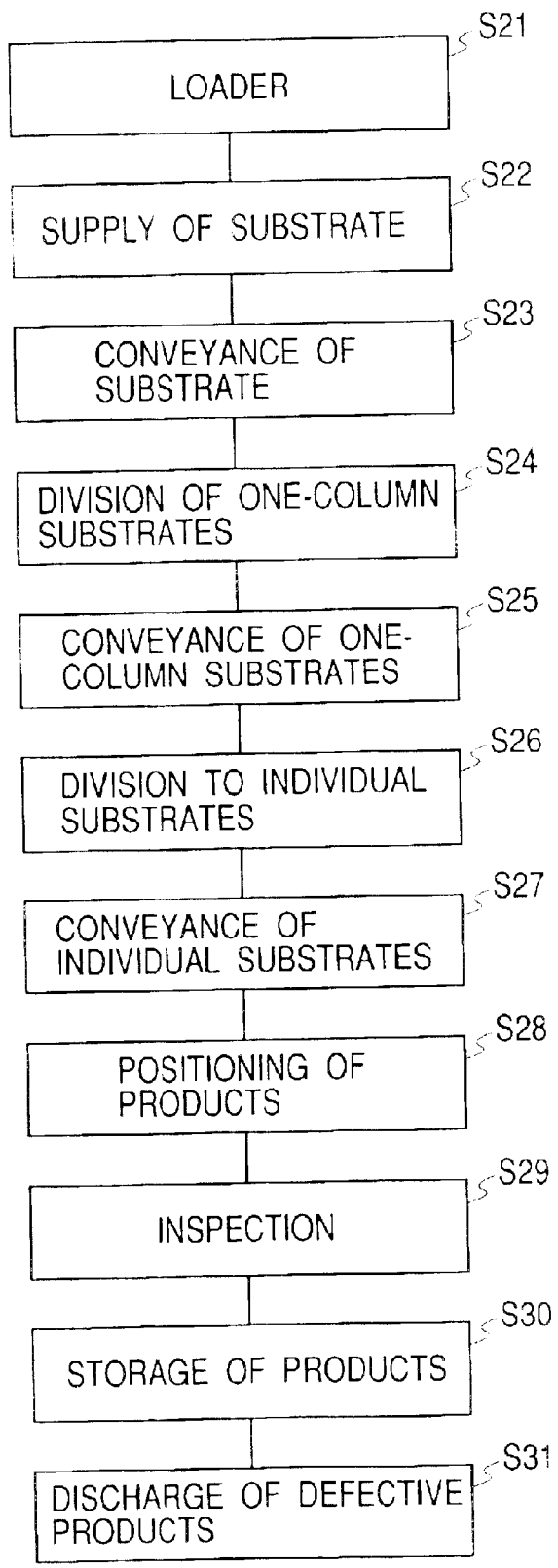
FIG. 27 is a flow chart of a substrate dividing process, showing an example of an operation procedure of a substrate dividing apparatus used in a substrate dividing step which is involved in the high-frequency module assembling procedure shown in FIG. 24.
Figure 29:
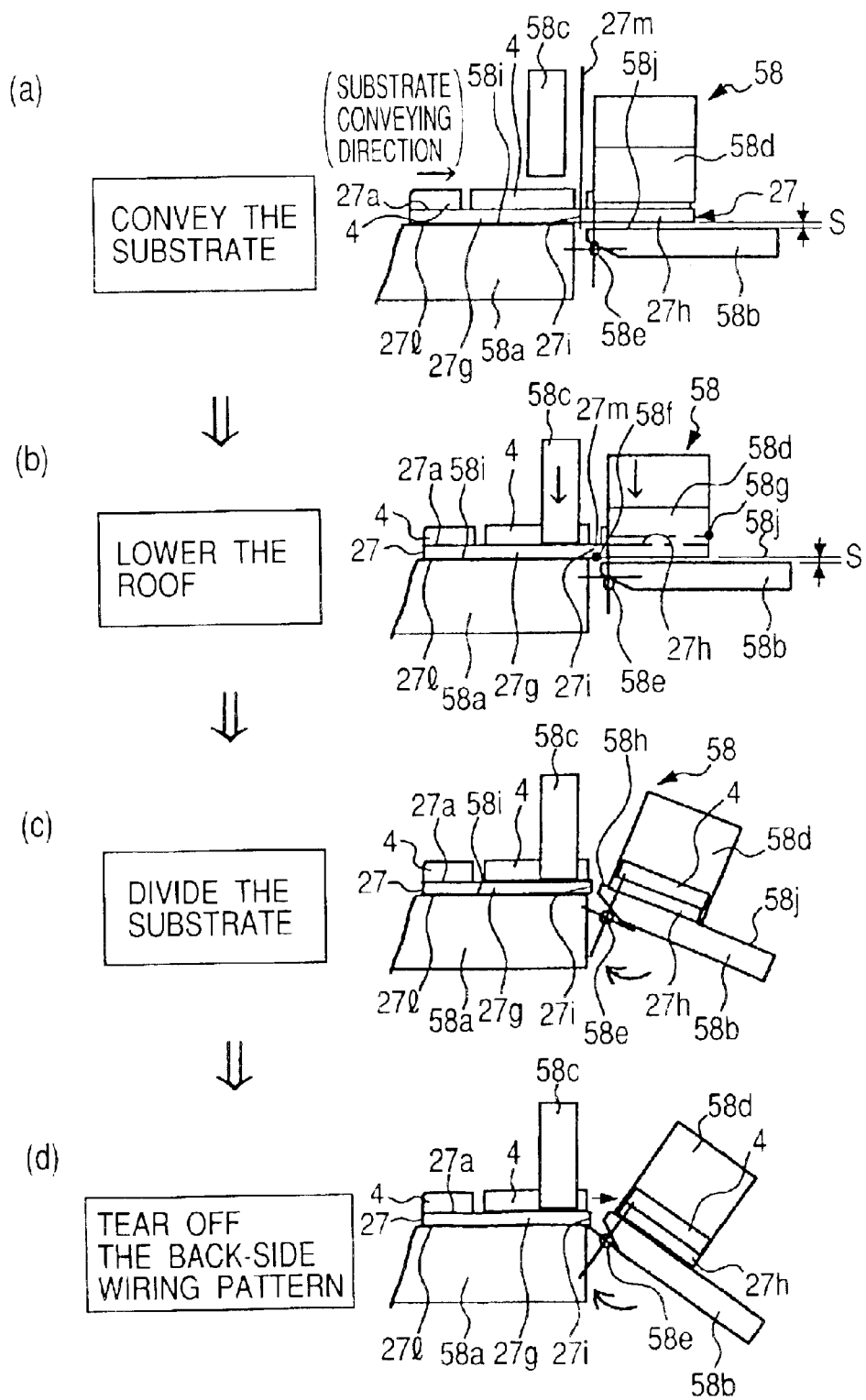
FIGS. 29(a), 29(b), 29(c), and 29(d) comprise a process flow chart and division principle diagrams corresponding to processes, showing an example of a one column substrates dividing method adopted in the substrate dividing step which is carried out in the semiconductor device manufacturing method according to the present invention.

In executing the one-column substrates dividing step S24 shown in FIG. 27, a substrate presser 58c and the dividing roof 58d are moved down, so that substrate pressing points 27k located in edge portions 27j shown in FIG. 28(a) of the remaining portion 27g in the matrix substrate 27 are pressed by the substrate presser 58c. At the same time, the dividing roof 58d is brought into contact with the dividing chute 58b located on each side of the matrix substrate 27 and is disposed on the matrix substrate while being kept out of contact with the caps 4 and the dividing portion 27h of the matrix substrate, as shown in FIG. 31.

Thereafter, the dividing chute 58b is pivoted downward. More specifically, with pivoting of the dividing chute 58b, as shown in FIG. 30(a), first the back side 27l of the dividing portion 27h pivots relative to the back side 27l of the remaining portion 27g of the matrix substrate 27, whereby the matrix substrate 27 is divided into the remaining portion 27g and the dividing portion 27h, with consequent extension of the associated wiring pattern 27f.

As the dividing chute 58b is further pivoted, as shown in FIG. 30(b), the back side 27l of the dividing portion 27h further pivots relative to the back side 27l of the remaining portion 27g of the matrix substrate 27, so that the dividing-side end portion 58h of the dividing chute 58b moves upward beyond the support surface 58i of the conveying chute 58a.

Consequently, it is possible to tear off the wiring pattern 27f.

In more particular terms, the rotational center 58e in pivoting the dividing portion 27h of the matrix substrate 27 to the back side 27I thereof is offset in both a direction perpendicular to the back side 27I on the back side of the matrix substrate from the dividing position 27i and a direction (outwards) of the dividing portion 27h from the dividing position 27i, so that, as shown in FIG. 29(c), the dividing-side end portion 58h of the dividing chute 58b projects upward beyond the support surface 58i of the conveying chute 58a.

As a result, the dividing position 27i at the one-column dividing line 27m on the matrix substrate 27 shown in FIG. 29(b) is thrust up by the dividing-side end portion 58h. This action exerts on a first point of action 58f.

Further, just after the start of pivoting of the dividing roof 58d the dividing roof 58d pivots downward in interlock with the dividing chute 58b, so that a load is applied from the dividing roof 58d to the left-hand edge portion 27j in FIG. 31 of the dividing portion 27h in the matrix substrate 27. This action exerts on a second point of action 58g.

With such actions on both first and second points of action 58f, 58g, as shown in FIG. 29(c), the matrix substrate 27 can be divided into the remaining portion 27g and the dividing portion 27h along the one-column dividing line 27m shown in FIG. 29(b).

Just thereafter, as shown in FIG. 29(d), the dividing chute 58b moves slightly in a direction away from the conveying chute 58a and this action causes the wiring pattern 27f shown in FIG. 28(b) to be torn off along the one-column dividing line 27m.

Thus, the two-stage motions comprising a motion of pushing up and dividing from below the one-column dividing line 27m on the matrix substrate 27 with pivoting of the dividing chute 58b and a motion of tearing off the wiring pattern 27f away from the conveying chute 58a are performed as a series of motions.

Further, the load from the dividing roof 58d is applied to only one end of each one-column dividing line 27m on the matrix substrate 27, so in the substrate dividing step one end portion (the left-hand side in FIG. 31) of the one-column dividing line 27m is cracked and divided.

Subsequently, the resulting individual dividing substrates 27e shown in FIG. 32 are conveyed in a line to the individual substrate dividing section 60 by the substrate conveying section 59 for individual division shown in FIG. 23(b) in accordance with the step S25 shown in FIG. 27.

In the individual substrate dividing section 60, first there is performed an individual substrate edge division and thereafter an individual substrate dividing step S26 of dividing the individual dividing substrates 27e shown in FIG. 32 into individual wiring substrates 2, i.e., individual high-frequency modules 1, is performed in about the same manner as in the one-column substrates dividing section 58. In connection with the individual substrate dividing step a description will be given below while replacing the matrix substrate 27 with the individual dividing substrates 27e.

The individual dividing substrates 27e formed from the matrix substrate 27 are the same as the matrix substrate in that they also have plural wiring substrates 2.

A movable roof 60d (a dividing tool) provided in the individual substrate dividing section 60 and serving as a loading portion is integral with a tilting plate 60b which is a movable portion. Thus, the movable roof 60d is pivotable interlockedly with the tilting plate 60b during pivoting of the tilting plate. The movable roof 60d has such a roof structure as covers only one end side (the right-hand side in FIG. 34) of each individual dividing line 27d on the individual dividing substrates 27e.

Figure 34:
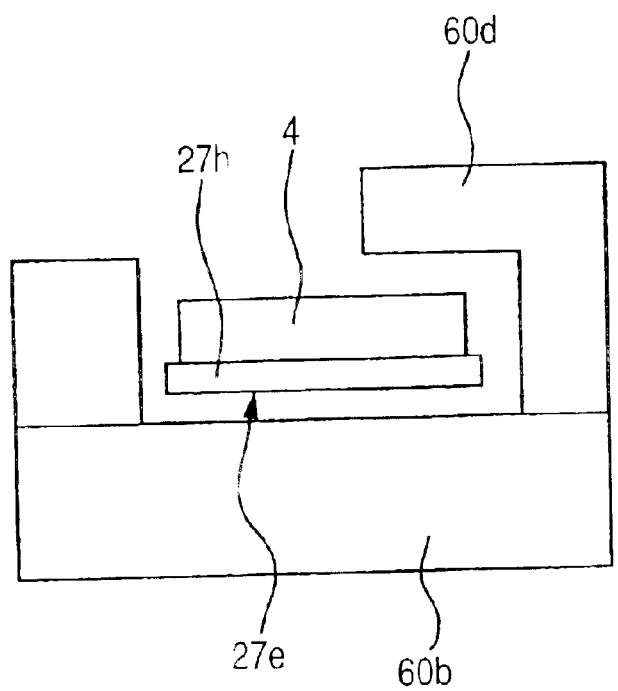
FIG. 34 is a side view showing a relation of arrangement between a loading portion and a dividing portion of the individual dividing substrate in the state illustrated in FIG. 33(b).

It is optional whether it is to be the right side or the left side in FIG. 34 that is covered with the movable roof 60d.

Thus, also in the dividing operation performed by the individual substrate dividing section 60 the substrate division can be done beginning with one end side (the right-hand side in FIG. 34) of the individual dividing lines 27d by applying a load to only one ends of the individual dividing lines 27d on the individual dividing substrates 27e.

Like the dividing chute 58b, the tilting plate 60b is pivotable to its lower side, i.e., in a direction opposite to the disposed side of the matrix substrate 27 and a pivot center 60e thereof is offset in both a direction perpendicular to the back side 27I of the matrix substrate 27 on the back side 27I from the dividing position 27i of each individual dividing line 27d and a direction of the dividing portion 27h disposed outside from the dividing position 27i.

Thus, the pivot center 60e of the tilting plate 60b is set at a position offset to both lower and right-hand sides in FIG. 33(a) with respect to the dividing position 27i.

Consequently, when the tilting plate 60b pivots downward about the pivot center 60e, as shown in FIG. 33(d), a dividing-side end portion 60h of the tilting plate 60b projects upward beyond a support surface 60i of a fixed chute 60a and just thereafter the tilting plate 60b moves in a direction away from the fixed chute 60a.

Further, as shown in FIG. 33(a), a difference in height, V=0.5 mm or so, is formed between a support surface 60j of the tilting plate 60b and the support surface 60i of the fixed chute 60a. Thus, the support surface 60j of the tilting plate 60b is lower than the support surface 60i of the fixed chute 60a.

Thus, by forming a gap of the above V or so between the support surface 60j of the tilting plate 60b and the back 27I of the dividing portion 27h of the individual dividing substrates 27e, not only an initial pivoting motion of the tilting plate 60b becomes smooth when the tilting plate pivots downward, but also the individual dividing lines 27d of the individual dividing substrates 27e can be pushed up strongly. As a result, the substrate division along each individual dividing line 27d can be done smoothly.

As shown in FIG. 33(a), distances (T), (U) between the dividing position 27i on the individual dividing substrates 27e and the pivot center 60e of the tilting plate 60b are, for example, T=2 mm and U=2 mm, a gap distance (W) between the movable roof 60d and the cap 4 is 0.2 mm, and a gap distance (X) between the fixed substrate presser 60c and the cap 4 is 0.2 mm or so.

In carrying out the individual substrate dividing step S26, first the remaining portion 27g (the remaining side after the substrate division) of the individual dividing substrates 27e obtained from the matrix substrate 27 is disposed on the fixed chute 60a, as shown in FIG. 33(a) and is thereby supported on the back side 27I thereof. At the same time, the dividing portion 27h (the side to be divided and cut off) contiguous to the remaining portion 27g is caused to project outside beyond the fixed chute 60a and is disposed on the tilting plate (movable portion) 60b.

Further, on the dividing portion 27h of the individual dividing substrates 27e is disposed the movable roof 60d so as to cover only one end side (the right-hand side in FIG. 34) of the dividing portion 27h, as shown in FIG. 34.

It suffices for the fixed substrate presser 60c to be constructed so that it can prevent floating of the cap during substrate division. As shown in FIG. 33(a), the substrate presser 60c is disposed on the cap 4 while forming a gap X of about 0.2 mm between it and the cap 4 so as not to cause damage to the cap which is a part of product (high-frequency module 1).

In the individual dividing substrates 27e, an area with cap 4 not attached thereto is a defective portion 66.

Thereafter, the tilting plate 60b is pivoted downward, as shown in FIG. 33(b).

At this time, the dividing-side end portion 60h of the tilting plate 60b projects upward beyond the support surface 60i of the fixed chute 60a, so that the dividing position 27i of each individual dividing line 27d on the individual dividing substrates 27e is pushed up by the dividing-side end portion 60h. This action is exerted on a first point of action 60f.

Further, just after pivoting of the tilting plate 60b, the movable roof 60d pivots downward interlockedly with the tilting plate, so that the load from the movable roof 60d is applied to the right-hand end in FIG. 34 of the dividing portion 27h of the individual dividing substrates 27e shown in the same figure. This action is exerted on a second point of action 60g.

With both actions exerted on the first and second points of action 60f, 60g, as shown in FIG. 33(c), the individual dividing substrates 27e can be divided into the remaining portion 27g and the dividing portion 27h along the associated individual dividing line 27d shown in FIG. 33(b).

Immediately thereafter, as shown in FIG. 33(d), the tilting plate 60b moves in a direction away from the fixed chute 60a, and with this action, the wiring pattern 27f is torn off along the individual dividing line 27d.

Thus, the two-stage motions comprising a motion of pushing up and dividing from below each individual dividing line on the individual dividing substrates 27e with pivoting of the dividing chute 58b and a motion of tearing off the wiring pattern 27f shown in FIG. 28(b) are preformed as a series of motions.

In this case, the load from the movable roof 60d is applied to only one end (the right-hand side in FIG. 34) of each individual dividing line 27d on the individual dividing substrates 27e, so in the substrate dividing step one end portion of the individual dividing line 27d is cracked and divided.

Thus, one end of the individual dividing line 27d is cracked and thereafter this crack is propagated to the opposite end of the individual dividing line 27d to effect substrate division along the dividing line 27d.

Subsequently, the individual dividing substrates 27e are conveyed pitch by pitch and are successively divided along the one-column dividing line 27m.

Now, the substrate division is completed as shown in FIG. 33(e).

The high-frequency modules 1 as divided products are fed while sliding on the tilting plate 60b.

Thereafter, the individual substrate conveying step S28 shown in FIG. 27 is performed by the individual conveying section 61 shown in FIG. 23(b).

Then, the product positioning step S27 shown in FIG. 27 is performed by the positioning section 62 shown in FIG. 23(b).

Each high-frequency module 1 as product is established its position with pawls or the like in four directions.

Thereafter, the inspecting step S29 is performed by the size checking section 63.

In this inspection, each high-frequency module 1 is inserted into an inspecting pocket to measure an external size of the high-frequency module 1.

Subsequently, a product storage step S30 is carried out in a product storage section 64.

In this step, high-frequency modules 1 judged to be non-defective in the size inspection are stored on a tray or the like.

Then, a defective product storage step S31 is carried out by means of a defective product discharge conveyor 65.

In this step, high-frequency modules 1 judged to be defective due to substrate burrs for example in the size inspection are discharged to the exterior by the defective product discharge conveyor 65.

Now, the substrate dividing step S9 shown in FIG. 24 is completed.

Thereafter, the characteristics selecting step S10 is carried out to obtain electrical characteristics of high-frequency modules 1 and the modules are sorted out in accordance with the results obtained.

Subsequently, the taping step S11 is carried out.

More specifically, the thus sorted plural high-frequency modules 1 are subjected to taping and taken up for storage onto the reel 43 shown in FIG. 25(i).

According to the fabrication method for the high-frequency modules 1 of this third embodiment the substrate dividing apparatus used therein, there are obtained the following functions and effects.

In the substrate dividing step in assembling each high-frequency module 1, since the pivot center 58e (60e) in pivoting the dividing portion 27h of the matrix substrate 27 (including the individual dividing substrates 27e) to the back side 271 (the second main surface) is offset in both a direction perpendicular to the back side 271 on the back side 271 of the matrix substrate from the dividing position 27i and a direction of the dividing portion 27h from the dividing position 27i, a force of pulling each wiring pattern 27f to the dividing portion 27h side can be exerted on the wiring pattern after substrate division.

That is, after substrate division, the wiring pattern pulling force can be exerted on the pattern by a series of operations, with the result that both substrate division and tearing-off the wiring pattern 27f can be done stably and automatically without causing damage to the product (high-frequency module 1).

Therefore, it is possible to automate the substrate dividing step including tearing-off of the wiring pattern 27f.

Consequently, it becomes possible to effect an automatic division of the matrix substrate 27 and hence possible to reduce the working cost. As a result, it is possible to decrease the cost of the high-frequency module 1.

Besides, since the matrix substrate can be divided always under the same conditions due to the attainment of an automatic division thereof, it is possible to improve the product quality in comparison with manual division.

Moreover, since the substrate dividing speed can be increased by the attainment of an automatic division of the matrix substrate 27, it is possible to shorten the time required for the substrate dividing work, with consequent improvement in throughput of the substrate dividing step.

Further, as in this third embodiment, even in case of dividing such a matrix substrate 27 as is formed with one-column dividing lines 27m and individual dividing lines 27d on its surface 27a as the first main surface and has plural caps 4 attached to the surface 27a, the wiring patterns 27f can be torn off smoothly along the one-column dividing lines 27m and individual dividing lines 27d as dividing grooves by pivoting the dividing portion 27h of the matrix substrate 27 to its back side 27l (the second main surface) for division.

Thus, even in the case of a matrix substrate 27 with caps already attached thereto, it is possible to make division into individual wiring substrates 2 (high-frequency modules) without causing damage to products.

As in this third embodiment, the matrix substrate 27 is divided into the remaining portion 27g and the dividing portion 27h and thereafter the wiring patterns 27f are torn off, whereby both substrate division and tearing-off of the wiring patterns can be done in a series of operations.

As a result, the substrate dividing work can be done stably.

Further, since the substrate division is started with the one end portions of the one-column dividing lines 27m and individual dividing lines 27d on the matrix substrate 27, it is possible to divide the matrix substrate 27 in a clean and smooth manner.

Moreover, the dividing roof 58d or movable roof 60d is provided interlockedly or integrally with the dividing chute 58b or tilting plate 60b in correspondence to the dividing portion 27h of the matrix substrate 27, and a load is applied to the dividing section 27h through the dividing roof 58d or movable roof 60d to divide the matrix substrate 27, further, the pivot center 58e (60e) of pivoting the dividing portion 27h is offset in both a direction perpendicular to the back side 27l on the back side 27l of the matrix substrate from the dividing position 27i and a direction to the dividing portion 27h from the dividing position 27i, whereby the substrate division and tearing off of the wiring patterns 27f can be done in a series of operations as two-stage motions.

Thus, both substrate division and tearing off of the wiring patterns 27f can be done stably without causing any damage to products. As a result, the substrate dividing step, including tearing-off of the wiring patterns 27f, can be automated.

Moreover, since the dividing portion 27h after division of the individual dividing substrates 27e is fed while sliding on the tilting plate 60b, it is possible to effect both substrate division and tearing-off of the wiring patterns 27f without clamping the dividing portion 27h (product). As a result, it is possible to prevent the product from being damaged.

Although the present invention has been described above concretely by way of embodiments thereof, it goes without saying that the invention is not limited to the embodiments, but that various changes may be made within the scope not departing from the gist of the invention.

For example, in the characteristics selecting step adopted in the second embodiment, electrical characteristics of the wiring substrates 2 are monitored, then characteristics of semiconductor pellets 21 are classified grade by grade, and a semiconductor device is assembled using an optimum combination of a wiring substrate 2 and semiconductor pellets 21. But in the case where required characteristics of the high-frequency module 1 are not obtained even by combining selected wiring substrate 2 and semiconductor pellets 21, for example chip parts 22 may be replaced to afford the required characteristics of the module.

Although in the above third embodiment both substrate division and tearing-off of wiring patterns are conducted without clamping the product (high-frequency module 1), the tearing-off of each wiring pattern may be done while clamping the product with a weak force not causing damage to the product.

Thus, by conducting the product division forcibly, not by natural drop, it is possible to improve the reliability of substrate division.

Although in the above third embodiment such movable portions as dividing chute 58b and tilting plate 60b are pivoted downward, the movable portions may be pivoted upward.

By so doing, even when dividing grooves are formed on only the back side 27l of the matrix substrate 27, it is possible to effect the substrate division.

If edge portions 27j located on the four sides of the matrix substrate 27 are divided beforehand using another unit different from the substrate dividing means and if the substrate dividing work (one-column division and individual division) in the third embodiment is performed using the matrix substrate 27 with edges 27j divided off beforehand, the speed of the substrate dividing work in the third embodiment can be further increased.

Moreover, by endowing the substrate dividing apparatus 54 with a size measuring (measuring detailed dimensions of length, width, and height) function, a function of visual inspection, or an appearance modifying function such as a burr removing function, it becomes possible to subject each product after substrate division to the size measurement, visual inspection, or appearance modification such as the removal of burrs.

If slits (flaws or grooves) are formed in the edge portions 27j of the matrix substrate 27 with a diamond cutter or the like before the substrate division, it is possible to further stabilize the substrate dividing work.

Although in the above third embodiment the substrate dividing work including tearing-off of wiring patterns is carried out automatically using the substrate dividing apparatus 54, it may be done manually without using the substrate dividing apparatus 54.

Although in the above third embodiment the matrix substrate to be divided is formed with wiring patterns, the substrate dividing method and apparatus (semiconductor device manufacturing apparatus) described in the third embodiment are also applicable to a matrix substrate not formed with wiring patterns. In this case, wiring patterns may be formed after substrate division.

Further, the semiconductor pellets 21 described in the above first to third embodiments may be obtained from a semiconductor wafer of silicon or of gallium arsenide. There also may be used SOI, GeSi, and TFT (Thin Film Transistor).

INDUSTRIAL APPLICABILITY

As set forth above, the semiconductor device manufacturing method and apparatus according to the present invention are suitable for the manufacture of module products at large assembled by mounting chip parts such as chip capacitor and resistor and bare chip mounting semiconductor pellets and using a matrix substrate. The method and apparatus in question are also suitable for the manufacture of high-frequency modules (high-frequency power amplifiers) to be incorporated in small-sized portable electronic devices such as portable telephones, especially thin portable electronic devices.

What is claimed is:

1. A method of manufacturing a semiconductor device which is assembled by mounting a chip for a passive element and a chip for an active element onto a wiring substrate, the method comprising the steps of:

disposing and mounting the chip for a passive element and the chip for an active element onto the wiring substrate; and attaching a cap having a recognition mark on a surface thereof to the wiring substrate to cover the chip for a passive element and the chip for an active element.

2. A method of manufacturing a semiconductor device which is assembled by mounting a chip for a passive element and a chip for an active element onto a wiring substrate, the method comprising the steps of:

disposing and mounting the chip for a passive element and the chip for an active element onto the wiring substrate; and inspecting a recognition mark of a cap having the recognition mark on a surface thereof and attaching the cap found to be non-defective in the inspection to the wiring substrate to cover the chip for a passive element and the chip for an active element.

3. A method of manufacturing a semiconductor device which is assembled by mounting a chip for a passive element and a chip for an active element onto a wiring substrate, the method comprising the steps of:

disposing and mounting the chip for a passive element and the chip for an active element onto each of plural wiring substrates formed on a matrix substrate; and attaching a cap having a recognition mark on a surface thereof to each of the wiring substrates on the matrix substrate to cover the chip for a passive element and the chip for an active element on the wiring substrate.

4. A method of manufacturing a semiconductor device which is assembled by mounting a chip for a passive element and a chip for an active element onto a wiring substrate, the method comprising the steps of:

disposing and mounting the chip for a passive element and the chip for an active element onto the wiring substrate;

affixing a recognition mark to a surface of a cap; and attaching the cap with the recognition mark thereon to the wiring substrate to cover the chip for a passive element and the chip for an active element, the mounting of the chip for a passive element and the chip for an active element onto the wiring substrate, the affixing of the recognition mark to the cap, and the mounting of the cap, being performed as a series of continuous operations.

5. A method of manufacturing a semiconductor device which is assembled by mounting a chip for a passive element and a chip for an active element onto each of plural wiring substrates formed on a matrix substrate, the method comprising the steps of:

disposing and mounting the chip for a passive element and the chip for an active element onto each of wiring substrates formed on the matrix substrate and found to be non-defective after inspection; and attaching caps to only the non-defective wiring substrates to cover the chip for a passive element and the chip for an active element mounted on each of the wiring substrates.

6. A method of manufacturing a semiconductor device which is assembled by successively performing the steps of mounting a chip for a passive element, mounting a chip for an active element, both onto each of plural wiring substrates formed on a matrix substrate, reflow of solder, wire bonding, resin coating, affixing of a recognition mark to a cap, mounting of the cap to each of the wiring substrates, and substrate cutting, the method comprising the step of affixing a defect mark to a wiring substrate found to be defective in inspection out of the wiring substrates formed on the matrix substrate, the defect mark being recognized every time each of the passive element chip mounting step and subsequent steps is carried out and said steps being not performed for the wiring substrate with the defect mark put thereon.

7. A method of manufacturing a semiconductor device which is assembled by successively performing the steps of mounting a chip for a passive element, mounting a chip for an active element, both onto each of plural wiring substrates formed on a matrix substrate, reflow of solder, wire bonding, resin coating, affixing of a recognition mark to a cap, mounting of the cap to each of the wiring substrates, and substrate cutting, the method comprising the step of conducting inspection after each of said steps to recognize whether there is any defect in the inspected step, and affixing a defect mark to the wiring substrate concerned, the defect mark being recognized every time each of the passive element chip mounting step and subsequent steps is carried out and the steps which follow the inspected step found to include a defect being not performed.

8. A method of manufacturing a semiconductor device which is assembled by mounting a chip for a passive element and a chip for an active element onto a wiring substrate, the method comprising the steps of:

printing solder to a terminal for the chip for a passive element;

thereafter applying solder by potting to a recess formed in the wiring substrate;

disposing the chip for a passive element onto the wiring substrate;

disposing the chip for an active element into the recess of the wiring substrate; and performing the reflow of solder to mount the chip for a passive element and the chip for an active element on the wiring substrate by solder connection.

9. The method of claim 8, wherein when the solder is discharged from a nozzle for potting, the nozzle is moved at a shortest distance within the wiring substrate and also for another adjacent wiring substrate, allowing the solder to be discharged into the recess formed in each of the wiring substrates.

10. A method of manufacturing a semiconductor device which is assembled by mounting a chip for a passive element and a chip for an active element onto a wiring substrate, the method comprising the steps of:

printing solder to a terminal for a passive element on the wiring substrate;

applying solder by potting to a recess formed in the wiring substrate;

disposing the chip for a passive element onto the wiring substrate;

disposing the chip for an active element into the recess formed in the wiring substrate; and reflowing solder to mount the chip for a passive element and the chip for an active element on the wiring substrate by solder connection.

11. A method of manufacturing a semiconductor device which is assembled by mounting a chip for a passive element and a chip for an active element onto a wiring substrate, the method comprising the steps of:

disposing the chip for a passive element onto the wiring substrate;

thereafter, disposing the chip for an active element into a recess formed in the wiring substrate; and mounting the chip for a passive element and the chip for an active element onto the wiring substrate by solder connection.

12. A method of manufacturing a semiconductor device which is assembled by mounting a chip for a passive element and a chip for an active element onto a wiring substrate, the method comprising the steps of:

supplying and disposing the chip for a passive element stored in each of plural parts supply sections provided in a parts loading apparatus to the wiring substrate parts supply section by parts supply section, the parts loading apparatus being for loading the chip for a passive element onto the wiring substrate;

disposing the chip for an active element into a recess formed in the wiring substrate; and mounting the chip for a passive element and the chip for an active element onto the wiring substrate by solder connection.

13. A method of manufacturing a semiconductor device which is assembled by mounting a chip for a passive element and a chip for an active element onto a wiring substrate, the method comprising the steps of:

recognizing a printed solder pattern formed on a terminal for the chip for a passive element on the wiring substrate and disposing the chip for a passive element onto the printed solder pattern;

disposing the chip for an active element into a recess formed in the wiring substrate; and mounting the chip for a passive element and the chip for an active element onto the wiring substrate by solder connection.

14. A method of manufacturing a semiconductor device which is assembled by mounting a chip for a passive element and a chip for an active element onto a wiring substrate, the method comprising the steps of:

disposing the chip for a passive element onto the wiring substrate;

supplying the chip for an active element stored in each of plural pellet supply sections provided in a pellet loading apparatus to the wiring substrate pellet supply section by pellet supply section, and disposing it into a recess formed in the wiring substrate, the pellet loading apparatus being for loading the chip for an active element onto the wiring substrate; and mounting the chip for a passive element and the chip for an active element on the wiring substrate by solder connection.

15. A method of manufacturing a semiconductor device which is assembled by mounting a chip for a passive element and a chip for an active element onto a wiring substrate, the method comprising the steps of:

disposing the chip for a passive element onto the wiring substrate;

recognizing an edge portion of the recess formed in the wiring substrate and disposing the chip for an active element into the recess; and mounting the chip for a passive element and the chip for an active element on the wiring substrate by solder connection.

16. A method of manufacturing a semiconductor device which is assembled by mounting a chip for a passive element and a chip for an active element onto a wiring substrate, the method comprising the steps of:

disposing the chip for a passive element onto each of plural wiring substrates formed on a matrix substrate, the wiring substrates being partitioned by dividing grooves;

disposing the chip for an active element into a recess formed in each of the wiring substrates;

mounting the chip for a passive element and the chip for an active element on each of the wiring substrates by solder connection; and applying a sealing resin by potting to the recesses of the plural wiring substrates while avoiding the dividing grooves to seal the chips for an active element on the wiring substrates with the resin.

17. A method of manufacturing a semiconductor device which is assembled by mounting a chip for a passive element and a chip for an active element onto a wiring substrate, the method comprising the steps of:

disposing and mounting the chip for a passive element and the chip for an active element onto each of plural wiring substrates formed on a matrix substrate; and inserting one of opposed hook support portions of each of caps into a corresponding one of hook holes obliquely which hook holes are formed in the matrix substrate, the hook support portions respectively supporting hooks which are engageable with each of the wiring substrates, to mount the caps to the matrix substrate, thereby allowing the chip for a passive element and the chip for an active element on each of the wiring substrates of the matrix substrate to be covered with each of the caps.

18. The method of claim 17, wherein when mounting the plural caps to the matrix substrate, the hook support portion disposed on an adjacent cap-free side, out of the opposed hook support portions of each of the caps, is first inserted into the corresponding hook hole formed in the matrix substrate to mount each of the caps onto the matrix substrate.

19. A method of manufacturing a semiconductor device which is assembled by mounting a chip for a passive element and a chip for an active element onto a wiring substrate, the method comprising the steps of:

disposing and mounting the chip for a passive element and the chip for an active element onto each of plural wiring substrates formed on a matrix substrate;

inserting one of opposed hook support portions of each of caps into a corresponding one of hook holes obliquely which hook holes are formed in the matrix substrate, the hook support portions respectively supporting hooks which are engageable with each of the wiring substrates;

allowing a load to be applied by the associated wiring substrate to the one hook support portion inserted into the hook hole, thereby causing the one hook support portion to deflect within an elastic range thereof in a direction away from the other hook support portion, and disposing the hook of the other hook support portion at a position above an opposite hook hole formed in the matrix substrate;

inserting the other hook support portion into the opposite hook hole; and releasing the load applied by the wiring substrate, allowing the hook of the one hook support portion and the hook of the other hook support portion to engage to the wiring substrate, and mounting the caps to the matrix substrate.

20. A method of manufacturing a semiconductor device which is assembled by mounting a chip for a passive element and a chip for an active element onto a wiring substrate, the method comprising the steps of:

disposing the chip for a passive element onto a selected wiring substrate as the wiring substrate;

disposing a selected chip for an active element as the chip for an active element into a recess formed in the wiring substrate; and mounting the chip for a passive element and the chip fox an active element onto the wiring substrate by solder connection, the selected wiring substrate and the selected chip for an active element being mounted in combination with each other so that characteristics of the semiconductor device fall under an allowable range.

* * * * *